US011527217B2

(12) United States Patent
Chang et al.

(10) Patent No.: US 11,527,217 B2
(45) Date of Patent: Dec. 13, 2022

(54) DISPLAY PANEL

(71) Applicant: InnoLux Corporation, Miao-Li County (TW)

(72) Inventors: Geng-Fu Chang, Miao-Li County (TW); Tsau-Hua Hsieh, Miao-Li County (TW); Jui-Feng Ko, Miao-Li County (TW); Tung-Kai Liu, Miao-Li County (TW); Hirofumi Watsuda, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 780 days.

(21) Appl. No.: 15/631,123

(22) Filed: Jun. 23, 2017

(65) Prior Publication Data

US 2017/0372677 A1 Dec. 28, 2017

Related U.S. Application Data

(60) Provisional application No. 62/355,392, filed on Jun. 28, 2016.

(30) Foreign Application Priority Data

Jan. 4, 2017 (CN) .......................... 201710005452.2

(51) Int. Cl.
*G09G 5/10* (2006.01)
*H01L 31/16* (2006.01)
(Continued)

(52) U.S. Cl.
CPC ................ *G09G 5/10* (2013.01); *G09G 3/32* (2013.01); *G09G 3/3233* (2013.01);
(Continued)

(58) Field of Classification Search
None
See application file for complete search history.

(56) References Cited

U.S. PATENT DOCUMENTS

| 2003/0169250 A1* | 9/2003 | Kimura | ................ | G09G 3/3266 345/212 |
|---|---|---|---|---|
| 2007/0210994 A1* | 9/2007 | Chen | .................... | G09G 3/3233 345/76 |

(Continued)

FOREIGN PATENT DOCUMENTS

| CN | 101504820 A | 8/2009 |
| CN | 202383980 U | 8/2012 |
| CN | 103366654 A | 10/2013 |

OTHER PUBLICATIONS

Chinese language office action dated Feb. 3, 2020, issued in application No. CN 201710005452.2.

(Continued)

*Primary Examiner* — Dong Hui Liang
*Assistant Examiner* — Emily J Frank
(74) *Attorney, Agent, or Firm* — McClure, Qualey & Rodack, LLP

(57) ABSTRACT

A display panel including a first current source and a first pixel unit is provided. The first pixel unit includes a first switch and a first light-emitting diode. The first switch is coupled to the first current source and receives a first scan signal. When the first scan signal is enabled, the first switch is turned on and receives a first current provided by the first current source. The first light-emitting diode is coupled to the first switch. When the first switch is turned on, the first current passes through the first light-emitting diode to turn on the first light-emitting diode.

16 Claims, 22 Drawing Sheets

(51) Int. Cl.

| | | |
|---|---|---|
| *H01L 27/02* | (2006.01) | |
| *G09G 3/32* | (2016.01) | |
| *H01L 25/16* | (2006.01) | |
| *H01L 33/62* | (2010.01) | |
| *H01L 27/12* | (2006.01) | |
| *G09G 3/3233* | (2016.01) | |
| *G09G 3/3283* | (2016.01) | |

(52) U.S. Cl.
CPC ......... *G09G 3/3283* (2013.01); *H01L 25/167* (2013.01); *H01L 27/0251* (2013.01); *H01L 27/124* (2013.01); *H01L 27/1218* (2013.01); *H01L 27/1255* (2013.01); *H01L 31/16* (2013.01); *H01L 33/62* (2013.01); *G09G 2310/0289* (2013.01); *G09G 2310/08* (2013.01); *G09G 2320/045* (2013.01); *G09G 2320/064* (2013.01); *G09G 2360/148* (2013.01)

(56) References Cited

U.S. PATENT DOCUMENTS

| | | | | |
|---|---|---|---|---|
| 2008/0079001 A1* | 4/2008 | Umezaki | ............ | H01L 27/3276 257/59 |
| 2008/0174574 A1* | 7/2008 | Yoo | ...................... | G09G 3/3233 345/204 |
| 2010/0188390 A1* | 7/2010 | Min | ...................... | G09G 3/3291 345/212 |
| 2011/0292005 A1* | 12/2011 | Lau | ...................... | G09G 3/3688 345/204 |
| 2015/0206476 A1* | 7/2015 | Qi | ........................ | G09G 3/3233 345/76 |
| 2015/0243217 A1* | 8/2015 | Park | ...................... | G09G 3/3258 345/76 |
| 2015/0287362 A1* | 10/2015 | Lee | ...................... | G09G 3/3258 345/77 |
| 2015/0379927 A1* | 12/2015 | Cai | ...................... | G09G 3/3233 345/214 |
| 2016/0163259 A1* | 6/2016 | Kanda | .................. | G09G 3/3233 345/690 |
| 2016/0163260 A1* | 6/2016 | Takahashi | ............ | G09G 3/3233 345/207 |
| 2016/0247441 A1* | 8/2016 | Matsueda | ............ | G09G 3/2003 |
| 2017/0061877 A1* | 3/2017 | Lee | ...................... | H01L 27/3262 |
| 2017/0276983 A1* | 9/2017 | Miyazawa | ............... | G09G 3/20 |
| 2017/0294161 A1* | 10/2017 | Sun | ...................... | G09G 3/3233 |
| 2018/0061318 A1* | 3/2018 | Yin | ...................... | G09G 3/3233 |

OTHER PUBLICATIONS

Chinese language office action dated Aug. 12, 2020, issued in application No. CN 201710005452.2.

* cited by examiner

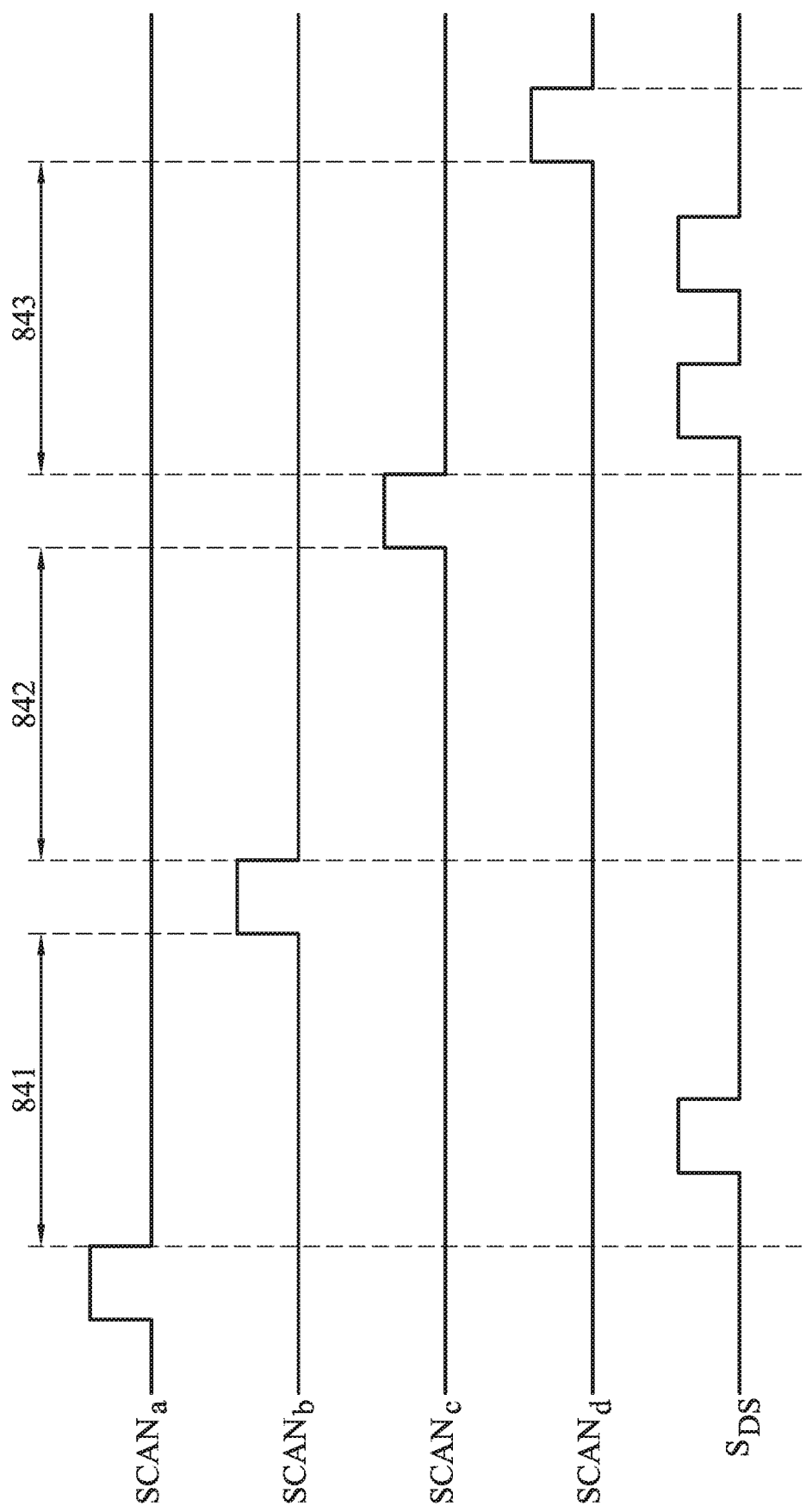

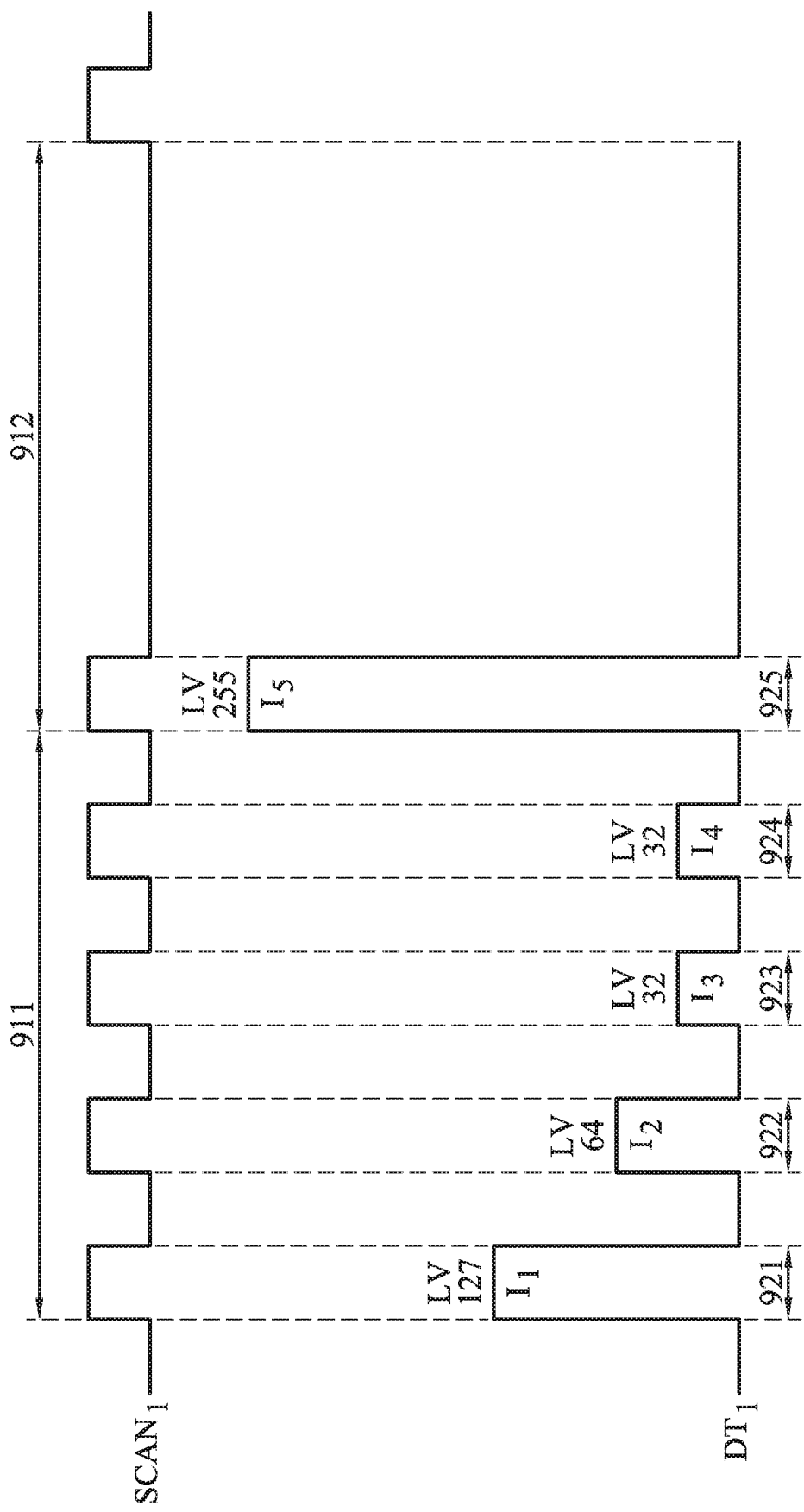

DISPLAY PANEL

CROSS REFERENCE TO RELATED APPLICATIONS

This application claims the benefit of U.S. Provisional Application No. 62/355,392, filed Jun. 28, 2016, which application is hereby incorporated by reference in its entirety.

This Application claims priority of China Patent Application No. 201710005452.2, filed on Jan. 4, 2017, the entirety of which is incorporated by reference herein.

BACKGROUND OF THE INVENTION

Field of the Invention

The invention relates to a display panel, and more particularly to a display panel with light-emitting diodes.

DESCRIPTION OF THE RELATED ART

Because cathode ray tubes (CRTs) are inexpensive and provide high definition, they are utilized extensively in televisions and computers. With technological development, new flat-panel displays are continually being developed. When a larger display panel is required, the weight of the flat-panel display does not substantially change compared to CRT displays.

BRIEF SUMMARY OF THE INVENTION

In accordance with an embodiment, a display panel comprises a first current source and a first pixel unit. The first pixel unit comprises a first switch and a first light-emitting diode. The first switch is coupled to the first current source and receives a first scan signal. When the first scan signal is enabled, the first switch is turned on and receives a first current provided by the first current source. The first light-emitting diode is coupled to the first switch. When the first switch is turned on, the first current passes through the first light-emitting diode to turn on the first light-emitting diode.

In accordance with another embodiment, a display panel comprises a pixel unit. The pixel unit comprises a first transmission switch, a first storage element, a first luminous unit, a second luminous unit, an emitting switch, and a level set unit. The first transmission switch receives a first scan signal and a first selection signal. The first storage element is coupled to the first transmission switch. The first luminous unit comprises a first switch and a first light-emitting diode. The first switch is coupled to the first storage element. The first light-emitting diode is coupled to the first switch. The second luminous unit is coupled to the first light-emitting unit in parallel and comprises a second switch and a second light-emitting diode. The second light-emitting diode is coupled to the second switch. The emitting switch is coupled to the first luminous unit and the second luminous unit and receives an emitting signal. The level set unit is coupled to the emitting switch to provide a predetermined level to the emitting switch.

In accordance with a further embodiment, a display panel comprises at least one pixel unit. The pixel unit comprises a first transistor, a second transistor, a storage element, a third transistor, a light-emitting diode, and a sensing element. The first transistor comprises a first gate, a first drain and a first source. The first gate receives a scan signal. The first drain receives a data signal. The second transistor comprises a second gate, a second drain and a second source. The second gate is coupled to the first source. The second drain receives a first operation voltage. The storage element is coupled to the first source and the second source. The third transistor comprises a third gate, a third drain and a third source. The third gate receives an emitting signal. The third source is coupled to the second source. The light-emitting diode comprises an anode and a cathode. The anode is coupled to the third drain. The cathode receives a second operation voltage. The sensing element detects the brightness of the light-emitting diode to generate a feedback signal.

BRIEF DESCRIPTION OF THE DRAWINGS

The invention can be more fully understood by referring to the following detailed description and examples with references made to the accompanying drawings, wherein:

FIG. 8C is a schematic diagram of an exemplary embodiment of a discharge signal, according to various aspects of the present disclosure;

FIG. 9 is a timing schematic diagram of an exemplary embodiment of the pixel unit, according to various aspects of the present disclosure;

DETAILED DESCRIPTION OF THE INVENTION

Figure 1:
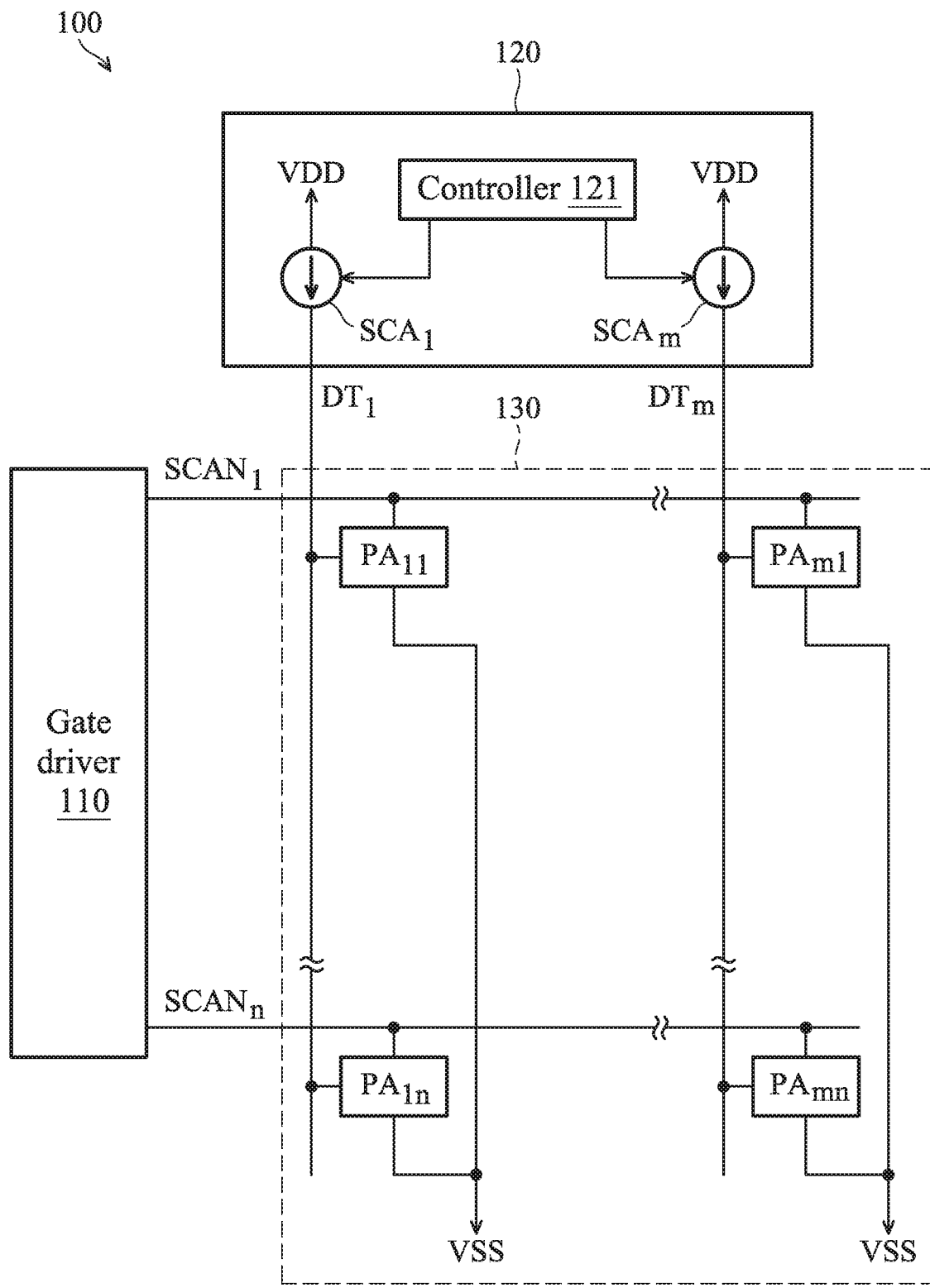
FIG. 1 is a schematic diagram of an exemplary embodiment of a display system, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a display system, according to various aspects of the present disclosure. The display system 100 comprises a gate driver 110, a source driver 120 and a display panel 130. In one embodiment, the display system 100 is a personal digital assistance (PDA), a cellular phone, a digital camera, a television, a global positioning system (GPS), an in-car display, an airplane display, a digital photo frame, a notebook computer, or a desktop computer.

The gate driver 110 is capable of generating scan signals $SCAN_1 \sim SCAN_n$. The source driver 120 is capable of generating data signals $DT_1 \sim DT_m$. In this embodiment, the data signals $DT_1$-$DT_m$ are current signals, but the disclosure is not limited thereto. In other embodiments, the data signals $DT_1 \sim DT_m$ are voltage signals.

As shown in FIG. 1, the source driver 120 at least comprises a controller 121 and current sources $SCA_1 \sim SCA_m$. Each of the current sources $SCA_1 \sim SCA_m$ receives a first operation voltage VDD. In one embodiment, the gate driver 110 and the source driver 120 are integrated into a chip disposed in the display panel 130.

The display panel 130 is coupled to the gate driver 110 and the source driver 120 and comprises a plurality of pixel units $PA_{11} \sim PA_{mn}$. Each of the pixel units $PA_{11} \sim PA_{mn}$ receives a scan signal, a data signal, and a second operation voltage VSS. When a specific scan signal is enabled, the corresponding pixel unit receives a corresponding data signal and provides light according to the data signal. Taking the pixel unit $PA_{11}$ as an example, when the scan signal $SCAN_1$ is enabled, the pixel unit $PA_{11}$ receives the data signal $DT_1$ and provides light according to the data signal $DT_1$. Furthermore, in this embodiment, the data signal $DT_1$ is a current signal. The current signal is adjusted to adjust the brightness of the light provided by the pixel unit $PA_{11}$.

Figure 2A:
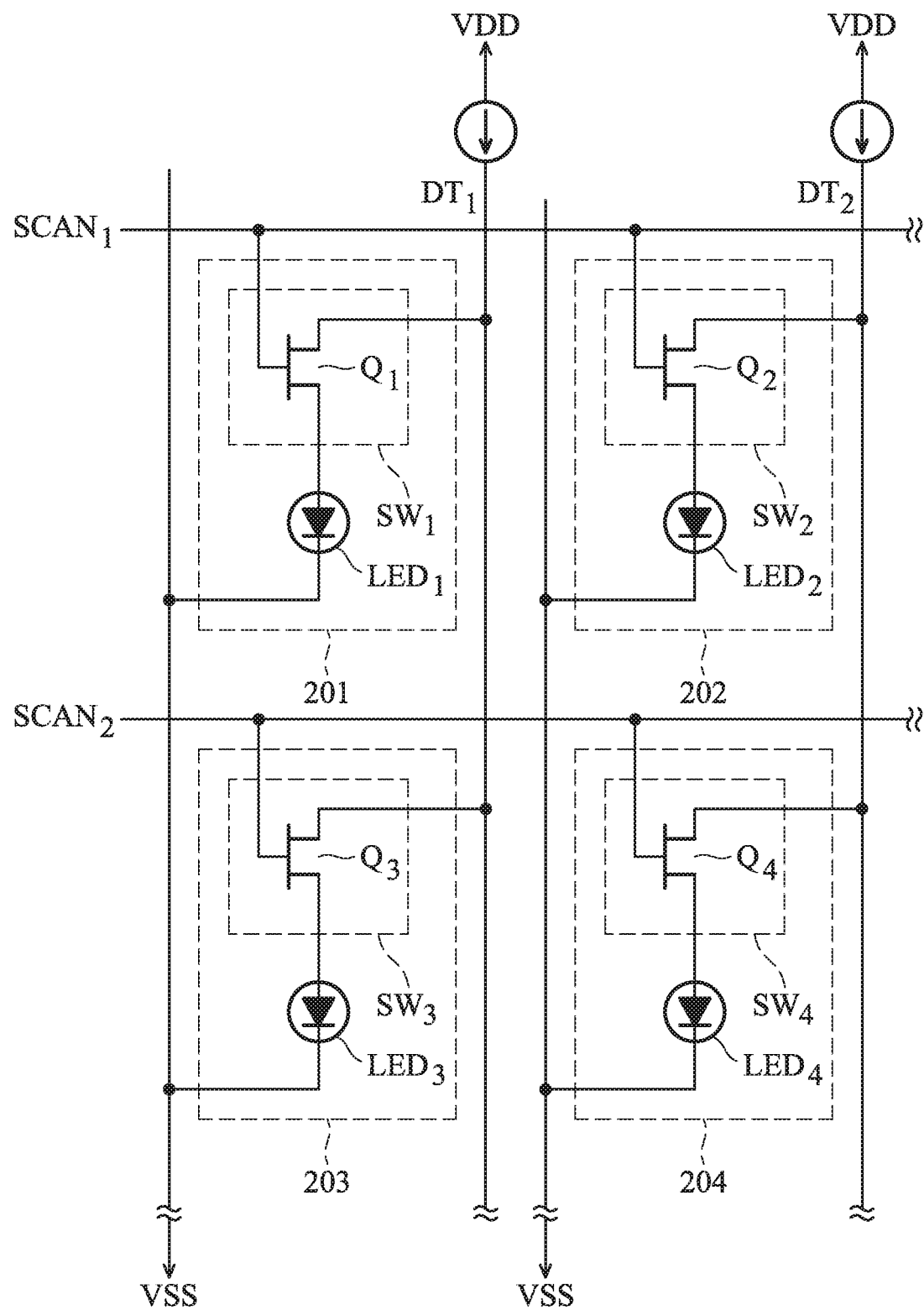
FIG. 2A is a schematic diagram of an exemplary embodiment of a pixel unit, according to various aspects of the present disclosure.

FIG. 2A is a schematic diagram of an exemplary embodiment of a pixel unit, according to various aspects of the present disclosure. For brevity, only four pixel units 201~204 are shown in FIG. 2A. Each of the pixel units 201~204 comprises a switch and a light-emitting diode. Since the structures and the operations of the pixel units 201~204 are the same, the pixel unit 201 is used as an example. As shown in FIG. 2A, the pixel unit 201 comprises a first switch $SW_1$ and a first light-emitting diode $LED_1$.

The first switch $SW_1$ receives a first scan signal $SCAN_1$. When the first scan signal $SCAN_1$ is enabled, the first switch $SW_1$ is turned on. In this embodiment, the first switch $SW_1$ is an N-type transistor $Q_1$. The gate of the N-type transistor $Q_1$ receives the first scan signal $SCAN_1$. The drain of the N-type transistor $Q_1$ receives the data signal $DT_1$. The source of the N-type transistor $Q_1$ is coupled to the first light-emitting diode $LED_1$. In some embodiments, the N-type transistor $Q_1$ is replaced by a P-type transistor.

The anode of the first light-emitting diode $LED_1$ is coupled to the source of the N-type transistor $Q_1$. The cathode of the first light-emitting diode $LED_1$ receives the second operation voltage VSS. In one embodiment, the first light-emitting diode $LED_1$ is a micro-LED. When the first switch $SW_1$ is turned on, a first current (i.e. the data signal $DT_1$) passes through the first light-emitting diode $LED_1$. Therefore, the first light-emitting diode $LED_1$ is turned on.

Figure 2B:
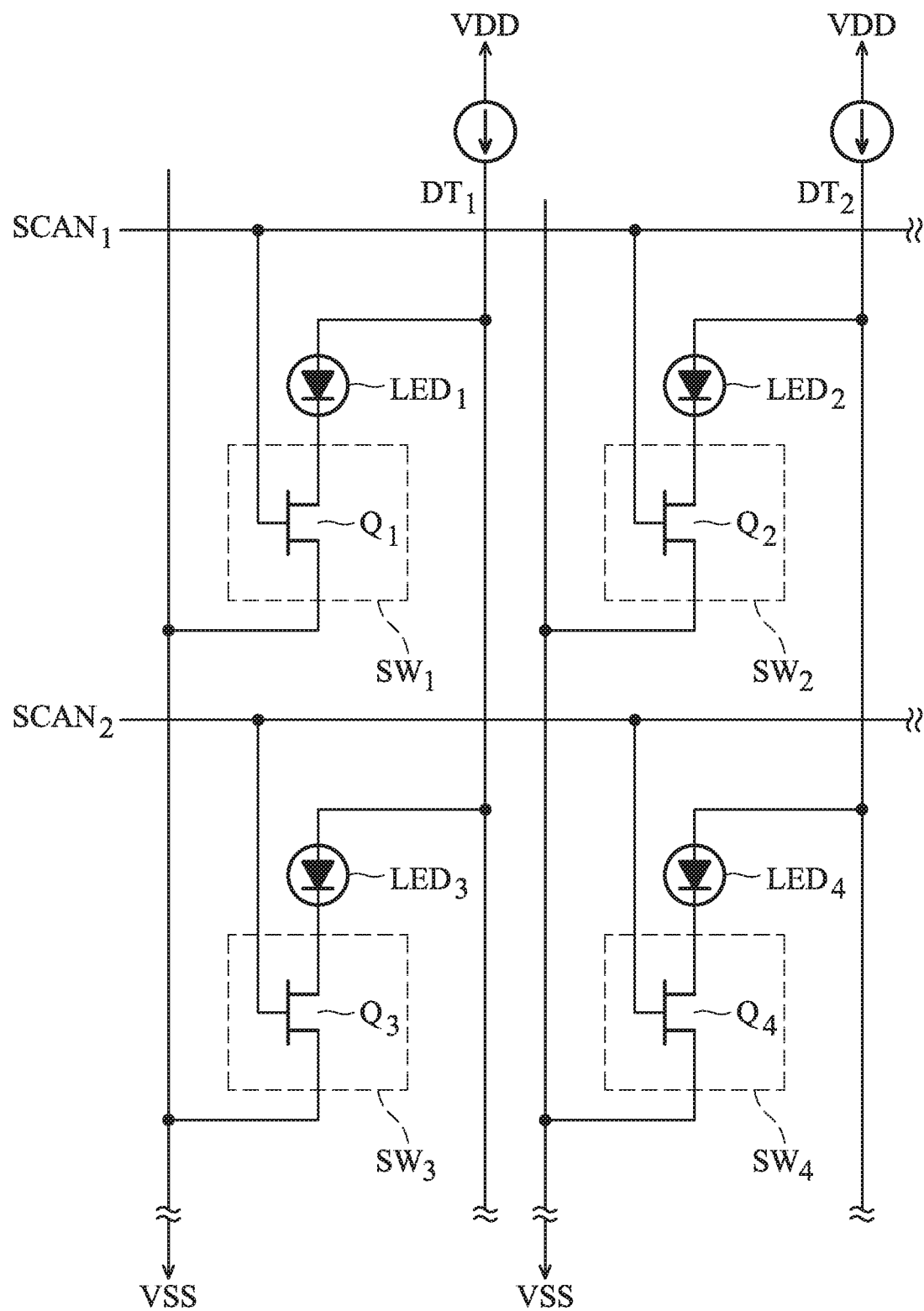
FIG. 2B is a schematic diagram of another exemplary embodiment of the pixel unit, according to various aspects of the present disclosure.

FIG. 2B is a schematic diagram of another exemplary embodiment of the pixel unit, according to various aspects of the present disclosure. FIG. 2B is similar to FIG. 2A except that the anode of the first light-emitting diode $LED_1$ shown in FIG. 2B receives the data signal $DT_1$, and the cathode of the first light-emitting diode $LED_1$ shown in FIG. 2B is coupled to the drain of the N-type transistor $Q_1$. Since the operation of the pixel unit shown in FIG. 2B is the same as the operation of the pixel unit shown in FIG. 2A, the description of the pixel unit shown in FIG. 2B is omitted. Additionally, the N-type transistor $Q_1$ shown in FIG. 2B is replaced by a P-type transistor.

Figure 3:
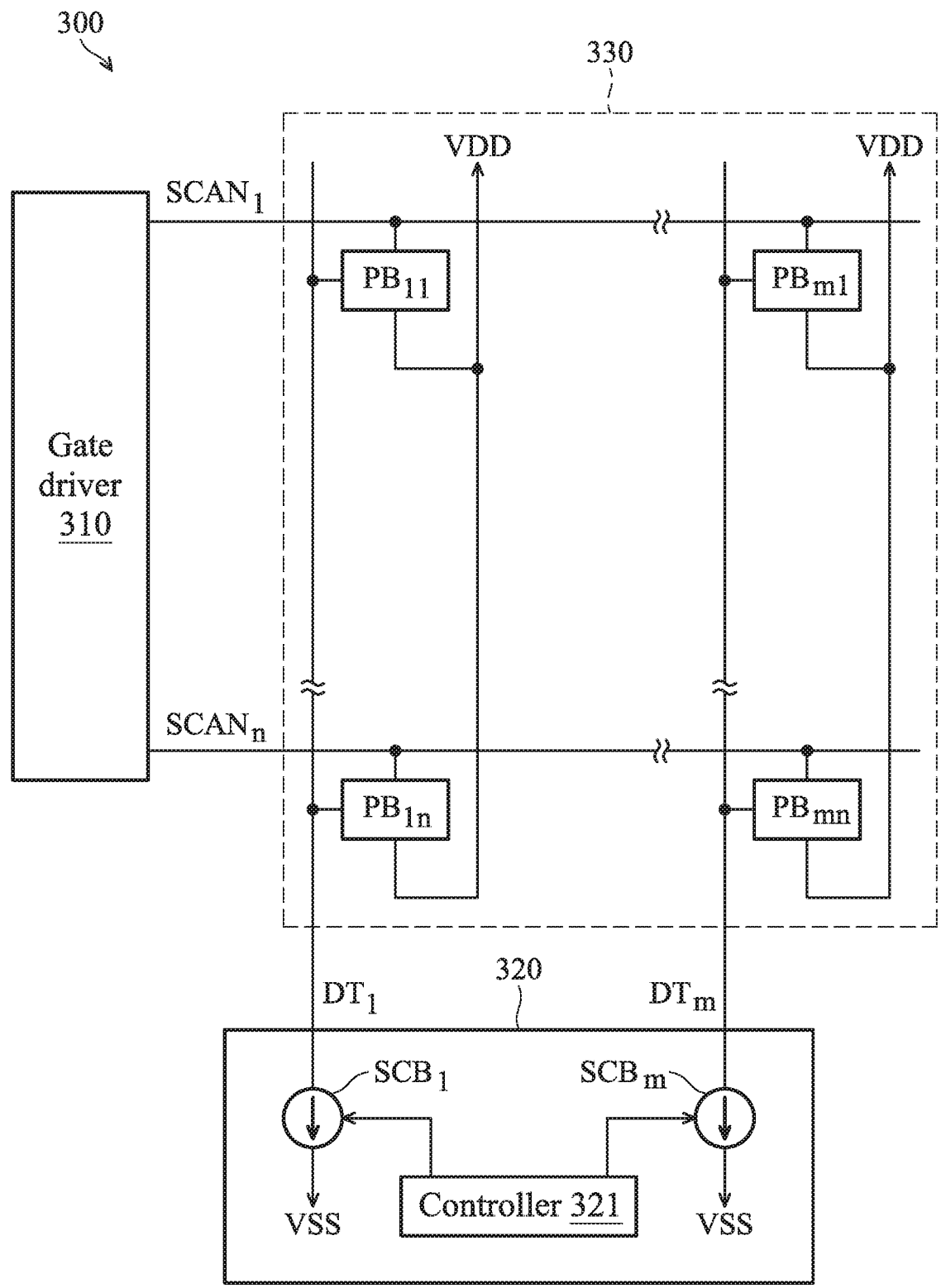
FIG. 3 is a schematic diagram of another exemplary embodiment of the display system, according to various aspects of the present disclosure.

FIG. 3 is a schematic diagram of another exemplary embodiment of the display system, according to various aspects of the present disclosure. FIG. 3 is similar to FIG. 1 except that the current sources $SCB_1 \sim SCB_m$ of the source driver 320 shown in FIG. 3 receive the second operation voltage VSS, and the pixel units $PB_{11} \sim PB_{mn}$ receive the first operation voltage VDD. Since the operation of the display system 300 shown in FIG. 3 is the same as the display system 100 shown in FIG. 1, the description of the display system 300 is omitted.

Figure 4A:
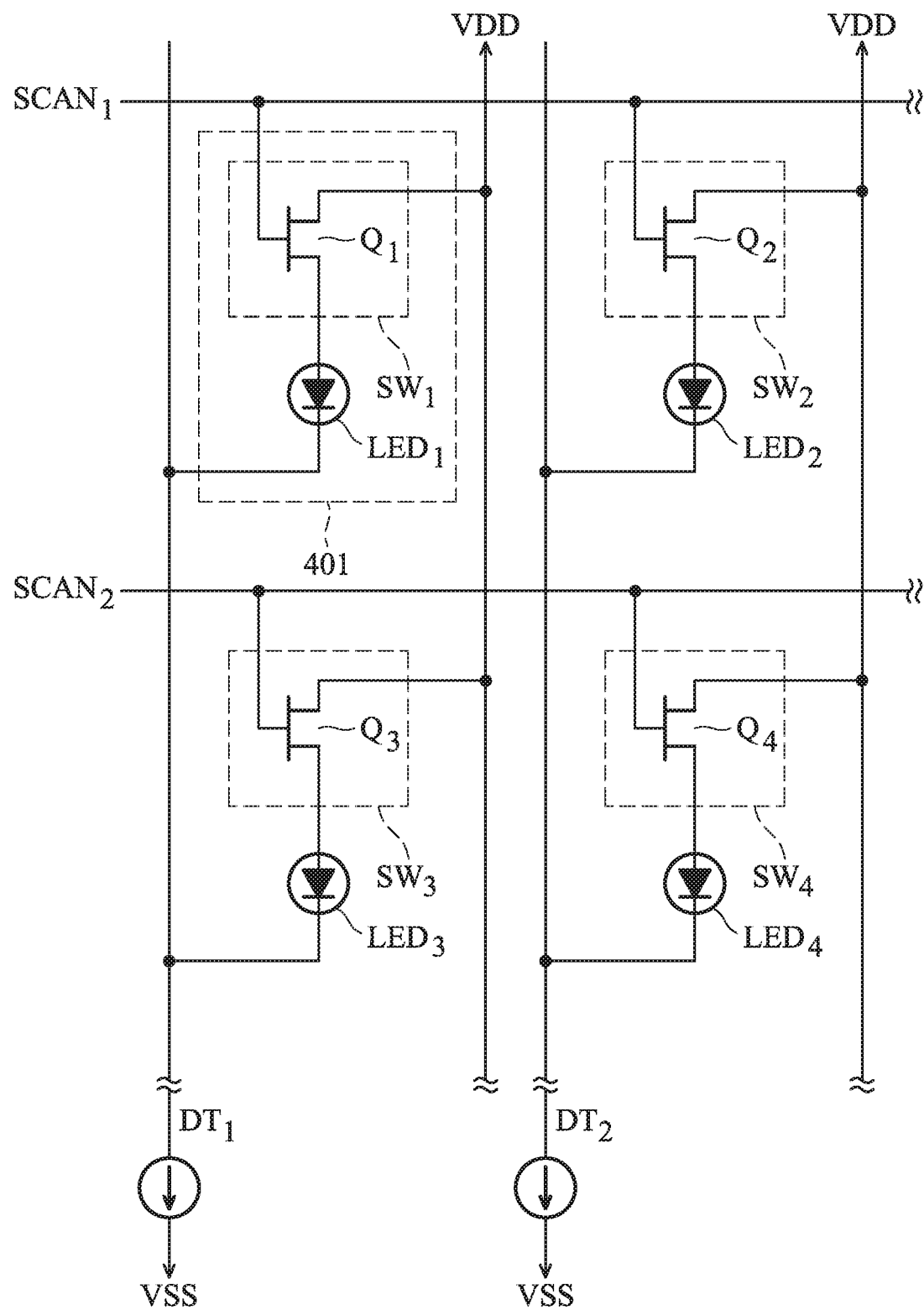
FIGS. 4A and 4B are schematic diagrams of other exemplary embodiments of the pixel unit, according to various aspects of the present disclosure.

FIG. 4A is a schematic diagram of another exemplary embodiment of the pixel unit, according to various aspects of the present disclosure. FIG. 4A is similar to FIG. 2A except that the drain of the N-type transistor $Q_1$ shown in FIG. 4A receives a first operation voltage VDD and the cathode of the first light-emitting diode $LED_1$ shown in FIG. 4A receives the data signal $DT_1$. When the N-type transistor $Q_1$ is turned on, the data signal $DT_1$ passes through the first light-emitting diode $LED_1$ to light the first light-emitting diode $LED_1$.

Figure 4B:
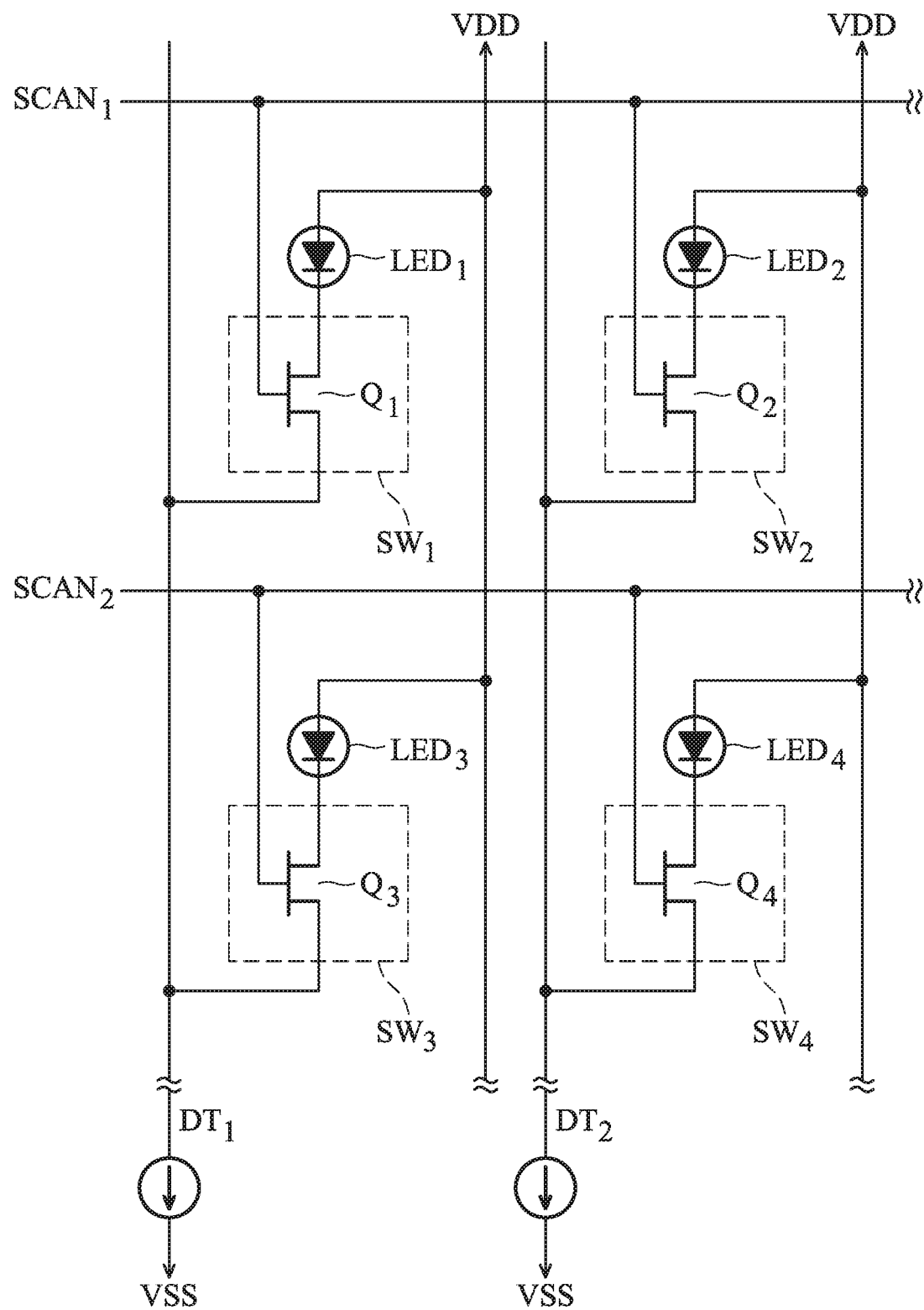

FIG. 4B is a schematic diagram of another exemplary embodiment of the pixel unit, according to various aspects of the present disclosure. FIG. 4B is similar to FIG. 4A except that the anode of the light-emitting diode $LED_1$ receives the first operation voltage VDD, and the cathode of the light-emitting diode $LED_1$ is coupled to the drain of the N-type transistor $Q_1$. In this embodiment, the source of the N-type transistor $Q_1$ receives the data signal $DT_1$. Since the operation of the pixel unit shown in FIG. 4B is the same as the operation of the pixel unit shown in FIG. 2A, the description of the operation of the pixel unit shown in FIG. 4B is omitted.

Figure 5A:
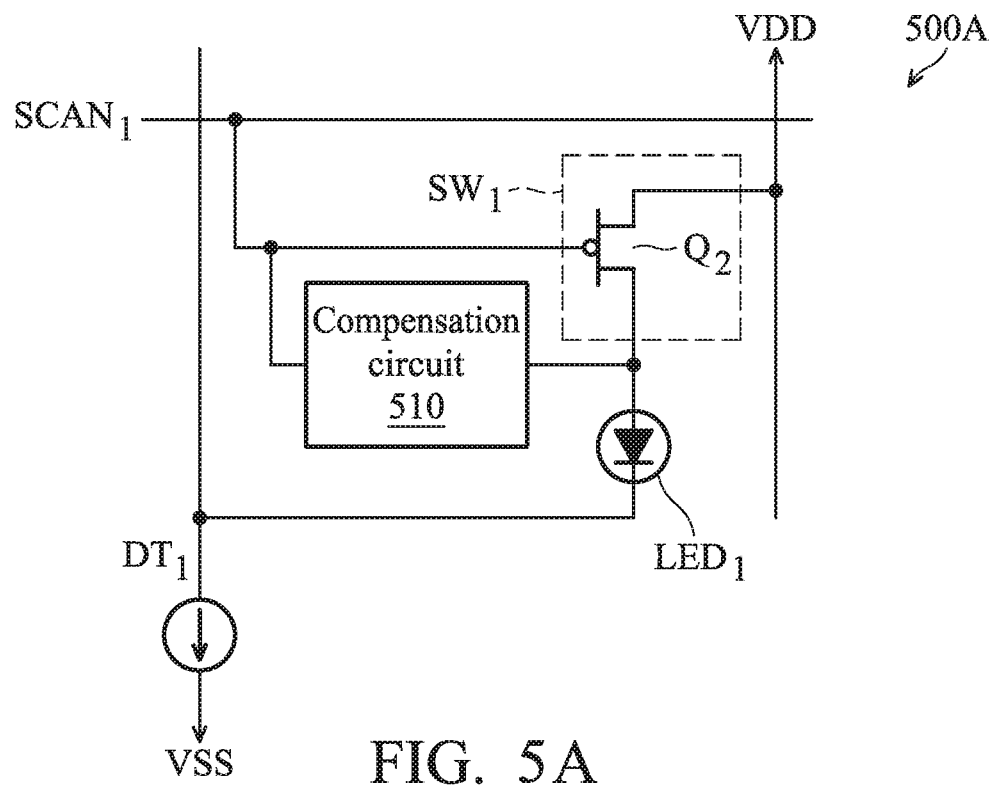
FIGS. 5A and 5B are schematic diagrams of other exemplary embodiments of the pixel unit, according to various aspects of the present disclosure.

FIG. 5A is a schematic diagram of another exemplary embodiment of the pixel unit, according to various aspects of the present disclosure. FIG. 5A is similar to FIG. 4A except that the first switch $SW_1$ shown in FIG. 5A is a P-type transistor $Q_2$, and the pixel unit 500A further comprises a compensation circuit 510. The compensation circuit 510 is coupled to the first switch $SW_1$ and the light-emitting diode $LED_1$ to compensate for the through voltage of the P-type transistor $Q_2$.

The disclosure is not limited by how the compensation circuit 510 compensates for the threshold voltage of the P-type transistor $Q_2$. Any circuit can serve as a compensation circuit 510, as long as the circuit is capable of detecting the threshold voltage of the P-type transistor $Q_2$ and adjusting the data signal $DT_1$ according to the detection result. In one embodiment, the compensation circuit 510 detects and records the threshold voltage of the P-type transistor $Q_2$ during a compensation period. During a data write period, the compensation circuit 510 adjusts the data signal $D_1$ according to the threshold voltage of the P-type transistor $Q_2$. During an emitting period, the first light-emitting diode $LED_1$ is lit to provide light. The first light-emitting diode $LED_1$ adjusts the brightness of the light according to the adjusted data signal $DT_1$. Then, the compensation circuit 510 removes the previous recorded threshold voltage of the P-type transistor $Q_2$ and again records the threshold voltage of the P-type transistor $Q_2$ during a removal period. In some embodiments, the compensation circuit 510 is also applied in at least one pixel unit shown in FIG. 2A and FIG. 4A.

Figure 5B:
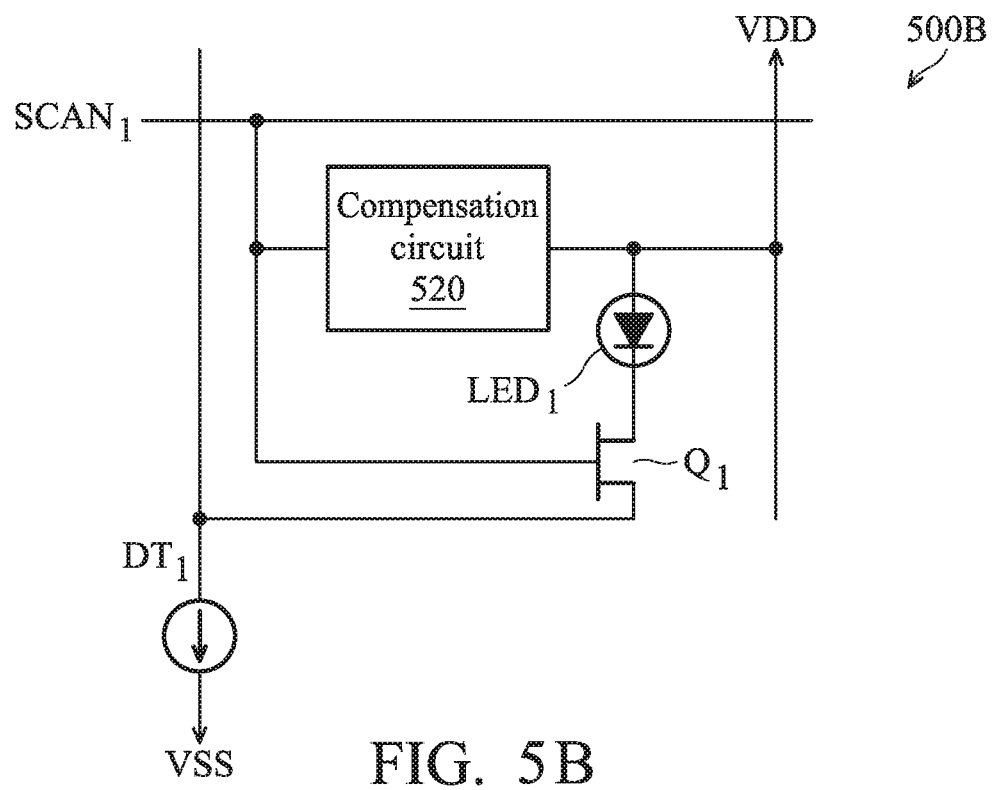

FIG. 5B is a schematic diagram of another exemplary embodiment of the pixel unit, according to various aspects of the present disclosure. FIG. 5B is similar to FIG. 4B except that the pixel unit 500B shown in FIG. 5B further comprises a compensation circuit 520. Since the operation of the compensation circuit 520 shown in FIG. 5B is the same as the operation of the compensation circuit 510 shown in FIG. 5A, the description of the operation of the compensation circuit 520 shown in FIG. 5B is omitted. In other embodiments, the compensation circuit 520 is also applied in at least one pixel unit shown in FIG. 2B and FIG. 4B.

Figure 6:
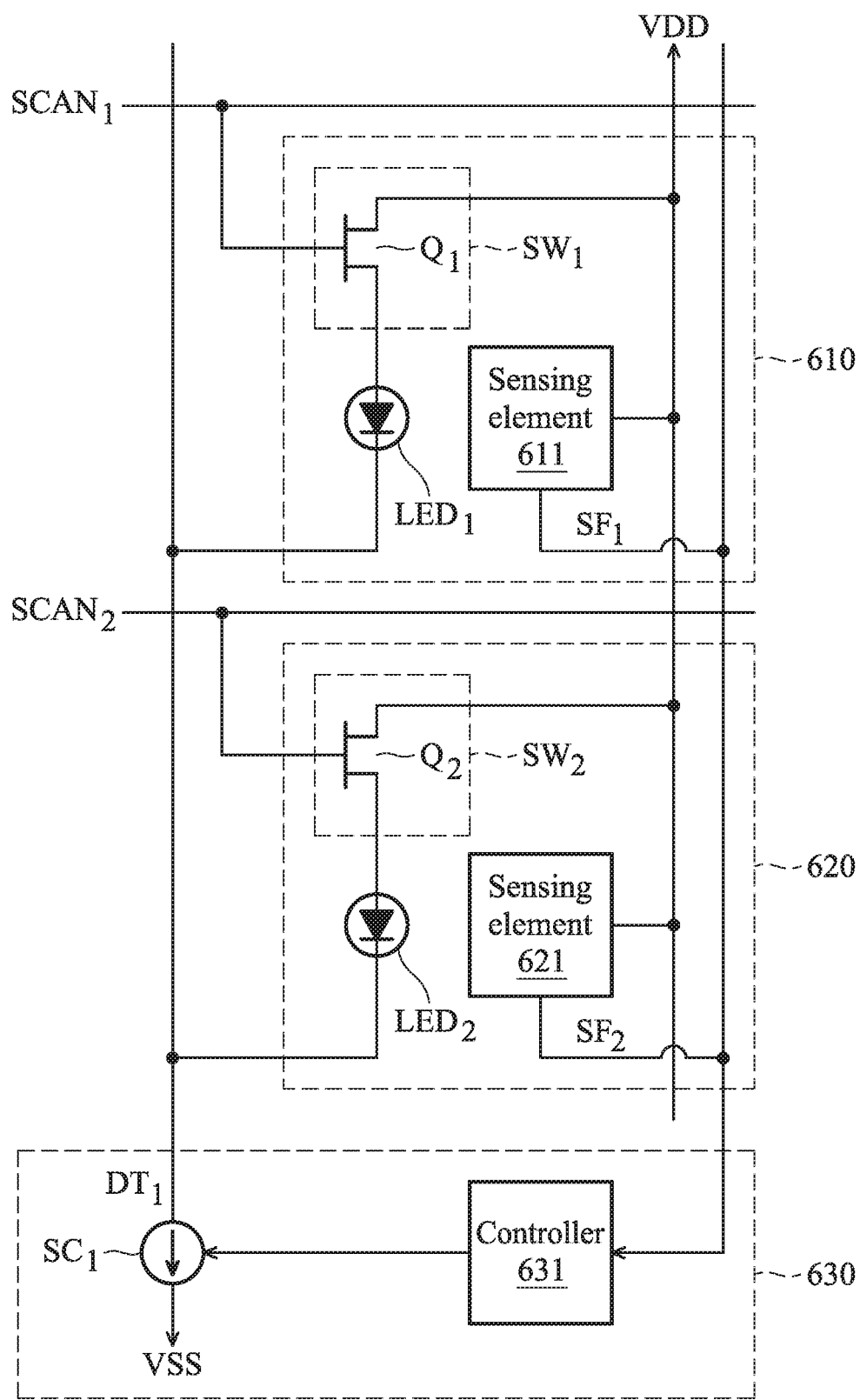
FIG. 6 is a schematic diagram of another exemplary embodiment of the pixel unit, according to various aspects of the present disclosure.

FIG. 6 is a schematic diagram of another exemplary embodiment of the pixel unit, according to various aspects of the present disclosure. For brevity, two neighboring pixel units 610 and 620 are shown in FIG. 6. Since the circuit structures of the pixel units 610 and 620 are the same, the pixel unit 610 is given as an example. As shown in FIG. 6, the pixel unit 610 receives the scan signal $SCAN_1$ and the data signal $DT_1$ and comprises a first switch $SW_1$, a first light-emitting diode $LED_1$ and a sensing element 611.

The operation of the first switch $SW_1$ is the same as the operation of the first switch $SW_1$ shown in FIG. 4A. The operation of the first light-emitting diode $LED_1$ is the same as the operation of the first light-emitting diode $LED_1$ shown in FIG. 4A. Therefore, descriptions of the operations of the first switch $SW_1$ and the first light-emitting diode $LED_1$ are omitted. When the first switch $SW_1$ is turned on, a first current (i.e. the data signal $DT_1$) passes through the first light-emitting diode $LED_1$. Therefore, the light-emitting diode $LED_1$ is turned on.

The sensing element 611 detects the brightness of the light-emitting diode $LED_1$ to generate a feedback signal $SF_1$. The feedback signal $SF_1$ is utilized to adjust the data signal $DT_1$. In one embodiment, the controller 631 of the source driver 630 adjusts the current source $SC_1$ according to the feedback signal $SF_1$ to adjust the current (i.e. the data signal $DT_1$) provided to the pixel unit 620. Therefore, when the scan signal $SCAN_2$ is enabled, the second switch $SW_2$ is turned on. At this time, a second current (i.e. the adjusted data signal $DT_1$) passes through the second light-emitting diode $LED_2$ such that the second light-emitting diode $LED_2$ is lit. The brightness of the second light-emitting diode $LED_2$ compensates for the shift in brightness of the first light-emitting diode $LED_1$ according to the adjusted data signal $DT_1$.

Similarly, when the second light-emitting diode $LED_2$ is lit, the sensing element 621 detects the brightness of the second light-emitting diode $LED_2$ to generate a feedback signal $SF_2$. The controller 631 adjusts the current source $SC_1$ according to the feedback signal $SF_2$ to adjust the brightness of the pixel units neighboring the pixel unit 620. Therefore, when the brightness of a specific light-emitting diode is shifted, the brightness of the light-emitting diode neighboring the specific light-emitting diode is adjusted to compensate for the brightness shift. In other embodiments, the sensing element 611 can be applied to at least one of the pixel units shown in FIG. 2A, FIG. 2B, FIG. 4A, FIG. 4B. FIG. 5A and FIG. 5B.

Figure 7:
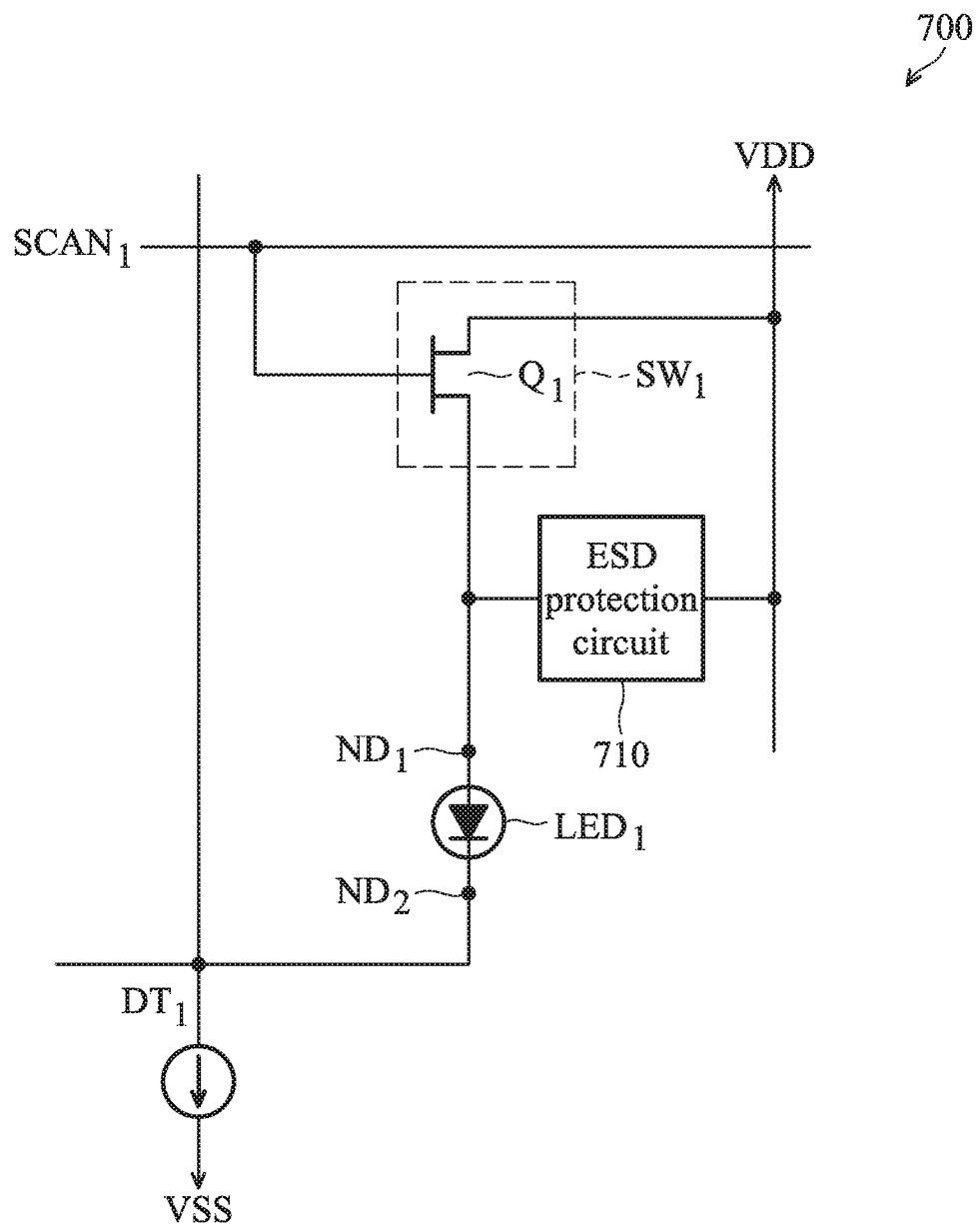
FIG. 7 is a schematic diagram of another exemplary embodiment of the pixel unit, according to various aspects of the present disclosure.

FIG. 7 is a schematic diagram of another exemplary embodiment of the pixel unit, according to various aspects of the present disclosure. The pixel unit 700 shown in FIG. 7 is similar to the pixel unit 401 shown in FIG. 4A except that the pixel unit 700 of FIG. 7 further comprises an electrostatic discharge (ESD) protection circuit 710. The ESD protection circuit 710 is coupled to the first switch $SW_1$. When the first light-emitting diode $LED_1$ is bonded on the nodes $ND_1$ and $ND_2$, an ESD event may occur on a node $ND_1$ or $ND_2$ and damage the first switch $SW_1$. Therefore, when the voltage of the node $ND_1$ or $ND_2$ exceeds to a set value, the ESD protection circuit 710 is activated to avoid an ESD current passing through the first switch $SW_1$.

The disclosure is not limited by the circuit structure of the ESD protection circuit 710. Any circuit can serve as an ESD protection circuit 710, as long as the circuit is capable of discharging the electrostatic discharge stress. In another embodiment, the ESD protection circuit 710 can be applied to at least one of the pixel units shown in FIG. 2A, FIG. 2B, FIG. 4A, FIG. 4B, FIG. 5A, FIG. 5B and FIG. 6.

Figure 8A:
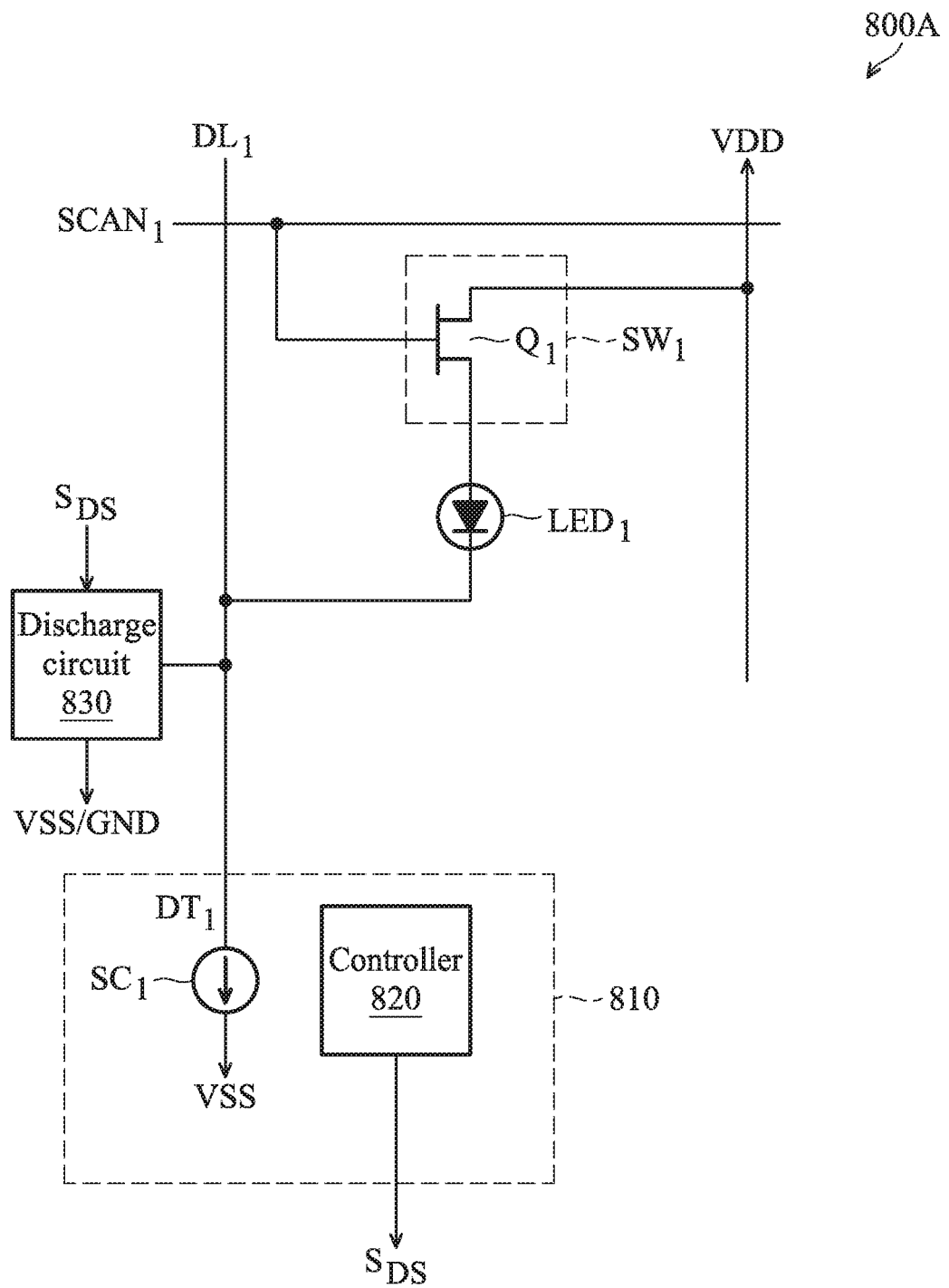
FIGS. 8A and 8B are schematic diagrams of other exemplary embodiments of the pixel unit, according to various aspects of the present disclosure.

FIG. 8A is a schematic diagram of another exemplary embodiment of the pixel unit, according to various aspects of the present disclosure. The pixel unit 800A shown in FIG. 8A is similar to the pixel unit 401 shown in FIG. 4A except that the pixel unit 800 of FIG. 8A further comprises a discharge circuit 830. The discharge circuit 830 is configured to discharge the voltage on at least one data line to avoid the remaining voltage interfering with the brightness of the first light-emitting diode $LED_1$. In short, only one data line is shown in FIG. 8A, but the disclosure is not limited thereto. In other embodiments, the discharge circuit 830 is coupled to a plurality of data lines. In some embodiments, many pixel units share one discharge circuit.

When the first switch $SW_1$ is turned on, a first current (i.e. the data signal $DT_1$) passes through the pixel unit 800A via the data line $DL_1$. Therefore, the first light-emitting diode $LED_1$ is turned on. When the first switch $SW_1$ is turned off and a discharge signal $S_{DS}$ is asserted, the discharge circuit 830 provides a low level (e.g. the operation voltage VSS or the ground voltage GND) to the data line DL to discharge the voltage on the data line $DL_1$.

The disclosure is not limited by the circuit structure of discharge circuit 830. Any circuit can serve as a discharge circuit 830, as long as the circuit is capable of discharging the voltage of the data line $DL_1$. In one embodiment, the discharge signal $S_{DS}$ is generated by the controller 820 of the source driver 810. In other embodiments, the discharge circuit 830 can be applied to at least one of the pixel units shown in FIG. 2A, FIG. 2B, FIG. 4A, FIG. 4B, FIG. 5A, FIG. 5B, FIG. 6 or FIG. 7.

Figure 8B:
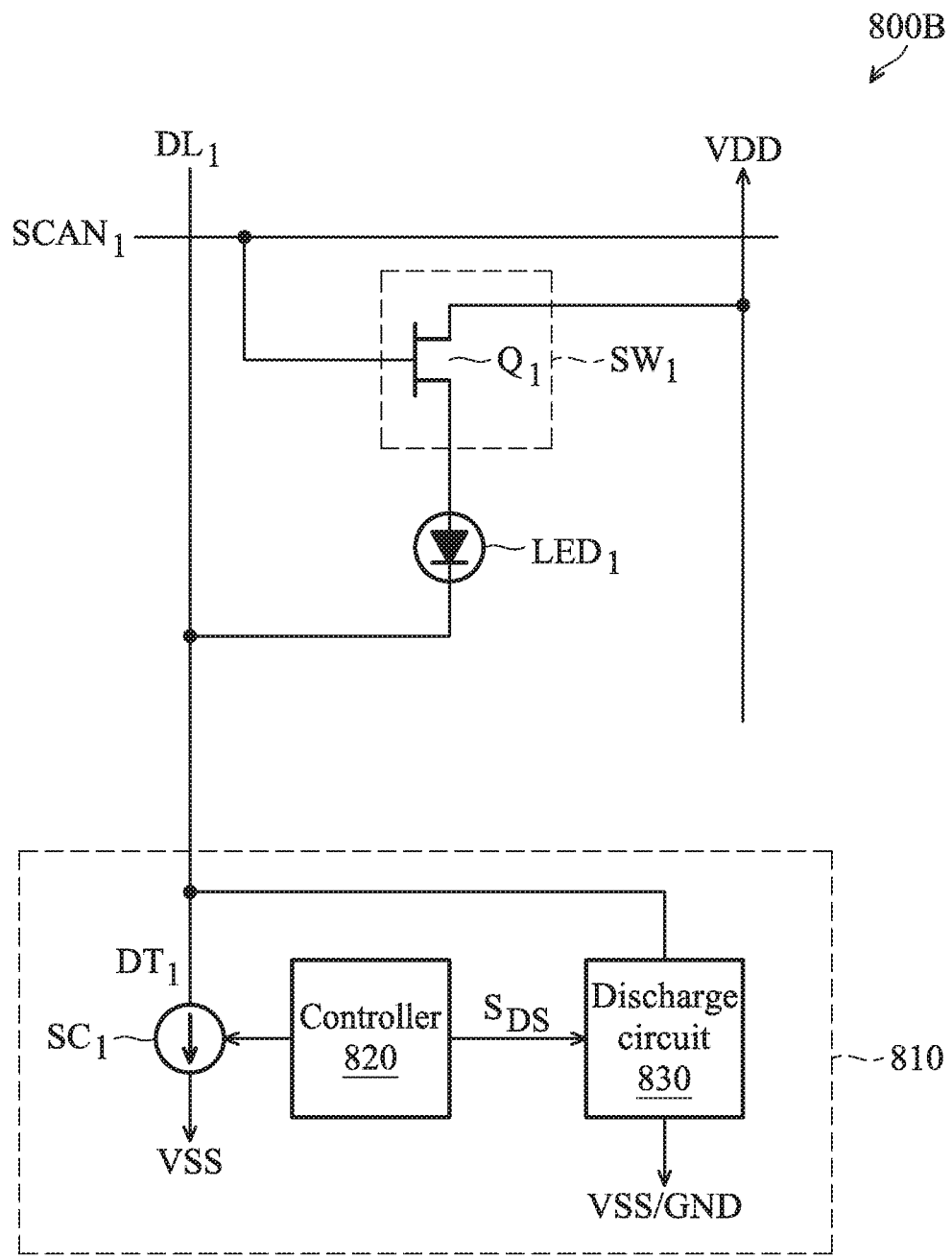

FIG. 8B is a schematic diagram of another exemplary embodiment of the pixel unit, according to various aspects of the present disclosure. FIG. 8B is similar to FIG. 8A except that the discharge circuit shown in FIG. 8B is integrated with the source driver 810. As shown in FIG. 8B, when the controller 820 asserts the discharge signal $S_{DS}$, the discharge circuit 830 provides the second operation voltage VSS or the ground voltage GND to the data line $DL_1$ to discharge the voltage on the data line $DL_1$.

FIG. 8C is a schematic diagram of an exemplary embodiment of a discharge signal, according to various aspects of the present disclosure. The symbols $SCAN_a$~$SCAN_d$ represent four scan signals of four scan lines arranged sequentially. For brevity, assume that a discharge circuit is coupled to all data lines. In this embodiment, since the discharge circuit is coupled to all data lines, when the discharge circuit is operating, no scan signal is enabled.

For example, no scan signal is enabled in periods 841~843. Therefore, the discharge signal $S_{DS}$ is enabled to activate the discharge circuit. When the discharge circuit is activated, the discharge circuit provides a low operation voltage (e.g. VSS or GND) to all data lines to discharge the voltage of all data lines.

The disclosure is not limited by the number of times that the discharge signal $S_{DS}$ is enabled. In one embodiment, the number of times that the discharge signal $S_{DS}$ is enabled is not a fixed value. For example, the number of times that the discharge signal $S_{DS}$ is enabled in the period 841 is less than the number of times that the discharge signal $S_{DS}$ is enabled in the period 843. Additionally, the number of times that the discharge signal $S_{DS}$ is enabled is maintained at a fixed value. For example, the discharge signal $S_{DS}$ is only enabled one time in period 843. In other embodiments, when no scan signal is enabled, the discharge signal $S_{DS}$ may not be enabled, as shown in period 842.

To control the brightness of the light-emitting diode of each pixel unit, in one embodiment, a single scan signal is enabled many times in a single frame to adjust the brightness of the light-emitting diode. FIG. 9 is a timing schematic diagram of an exemplary embodiment of the pixel unit, according to various aspects of the present disclosure. For brevity, two frames 911 and 912 are shown in FIG. 9. The number of times that the first scan signal $SCAN_1$ is enabled in frame 911 is different from the number of times that the first scan signal $SCAN_1$ is enabled in frame 912.

In addition, when the first scan signal $SCAN_1$ is enabled, if the first light-emitting diode $LED_1$ receives a current, the first light-emitting diode $LED_1$ is lit according to the current. The first light-emitting diode $LED_1$ displays different brightness when the first light-emitting diode $LED_1$ receives different currents. Therefore, the brightness first light-emitting diode $LED_1$ can be controlled. For example, assume that the first scan signal $SCAN_1$ is enabled during periods 921~924. In period 921, the first light-emitting diode $LED_1$ receives a first current $I_1$. In period 922, the first light-emitting diode $LED_1$ receives a second current $I_2$. In period 923, the first light-emitting diode $LED_1$ receives a third current $I_3$. In period 924, the first light-emitting diode $LED_1$ receives a fourth current $I_4$. The disclosure is not limited by the relationship between the first current $I_1$, the second current $I_2$, the third current $I_3$, and the fourth current $I_4$.

In one embodiment, one of the first current $I_1$, the second current $I_2$, the third current $I_3$, and the fourth current $I_4$ (e.g. the third current $I_3$) may be the same as or different than another of the first current $I_1$, the second current $I_2$, the third current $I_3$, and the fourth current $I_4$ (e.g. the fourth current $I_4$). In another embodiment, one of first current $I_1$, the second current $I_2$, the third current $I_3$, and the fourth current $I_4$ (e.g. the second current $I_2$) may be less than another of the first current $I_1$, the second current $I_2$, the third current $I_3$, and the fourth current $I_4$ (e.g. the first current $I_1$) or higher than another of the first current $I_1$, the second current $I_2$, the third current $I_3$, and the fourth current $I_4$ (e.g. the fourth current $I_4$). In other embodiments, at least one of the first current $I_1$, the second current $I_2$, the third current $I_3$, and the fourth current $I_4$ is equal to 0.

In this embodiment, assume that the first current $I_1$ represents the gray level LV127, the second current $I_2$ represents the gray level LV64, the third current $I_3$ represents the gray level LV32, and the fourth current $I_4$ represents the gray level LV32. In such cases, the brightness of the pixel unit 201 in the frame 911 is approximately equal to the brightness corresponding to a gray level LV255 (LV127+LV64+LV32+LV32). Therefore, the data signal $DT_1$ is controlled so that the pixel unit displays a different brightness.

Figure 10:
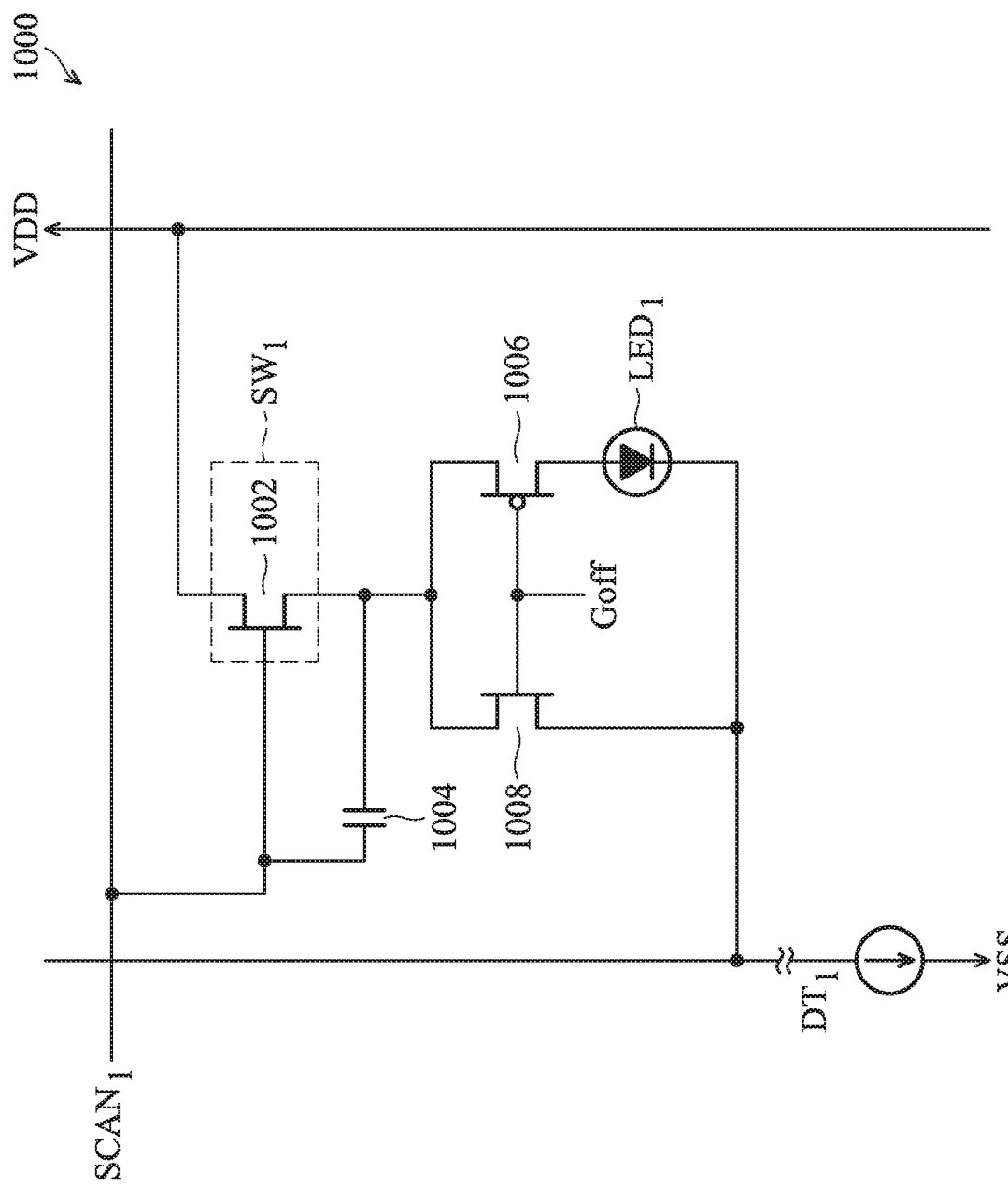
FIG. 10 is a schematic diagram of another exemplary embodiment of the pixel unit, according to various aspects of the present disclosure.

FIG. 10 is a schematic diagram of another exemplary embodiment of the pixel unit, according to various aspects of the present disclosure. FIG. 10 is similar to FIG. 4A except that the first switch $SW_1$ is indirectly coupled to the anode of the first light-emitting diode $LED_1$. As shown in FIG. 10, the pixel unit 1000 comprises the first switch $SW_1$, a capacitor 1004, a P-type transistor 1006, an N-type transistor 1008, and a first light-emitting diode $LED_1$.

In this embodiment, the first switch $SW_1$ is an N-type transistor 1002. The gate of the N-type transistor 1002 receives the first scan signal $SCAN_1$. The drain of the N-type transistor 1002 receives the first operation voltage VDD. The source of the N-type transistor 1002 is coupled to the anode of the light-emitting diode $LED_1$ via the P-type transistor 1006. The capacitor 1004 is coupled between the gate and the source of the N-type transistor 1002. The gate of the P-type transistor 1006 receives a turn-off signal Goff. The source of the P-type transistor 1006 is coupled to the source of the N-type transistor 1002. The drain of the P-type transistor 1006 is coupled to the anode of the light-emitting diode $LED_1$. The cathode of the light-emitting diode $LED_1$ receives the data signal $DT_1$. The gate of the N-type transistor 1008 receives the turn-off signal Goff. The drain of the N-type transistor 1008 is coupled to the source of the N-type transistor 1002. The source of the N-type transistor 1008 is coupled to the cathode of the first light-emitting diode $LED_1$.

In this embodiment, when the first scan signal $SCAN_1$ is enabled, the N-type transistor 1002 is turned on to charge the capacitor 1004. At this time, when the turn-off signal is at a low level, the P-type transistor 1006 is turned on to light the first light-emitting diode $LED_1$. When the first scan signal $SCAN_1$ is not enabled, the voltage stored in the capacitor 1004 is capable of turning on the N-type transistor 1002 so that the first light-emitting diode $LED_1$ is still lit. When the turn-off signal Goff is at a high level, the P-type transistor 1006 is turned off so that the first light-emitting diode $LED_1$ is turned off. At this time, since the N-type transistor 1008 is turned on, the voltage stored in the capacitor 1004 is discharged.

In this embodiment, the data signal $DT_1$ is a fixed current. The time at which the first light-emitting diode $LED_1$ is lit is controlled so that the first light-emitting diode $LED_1$ may provide different lights with different brightness. Furthermore, the first scan signal $SCAN_1$ is not continuously enabled. The N-type transistor 1002 can be continuously turned on, as long as the time that the first scan signal $SCAN_1$ is enabled is long enough to store voltage in the capacitor 1004.

Figure 11:
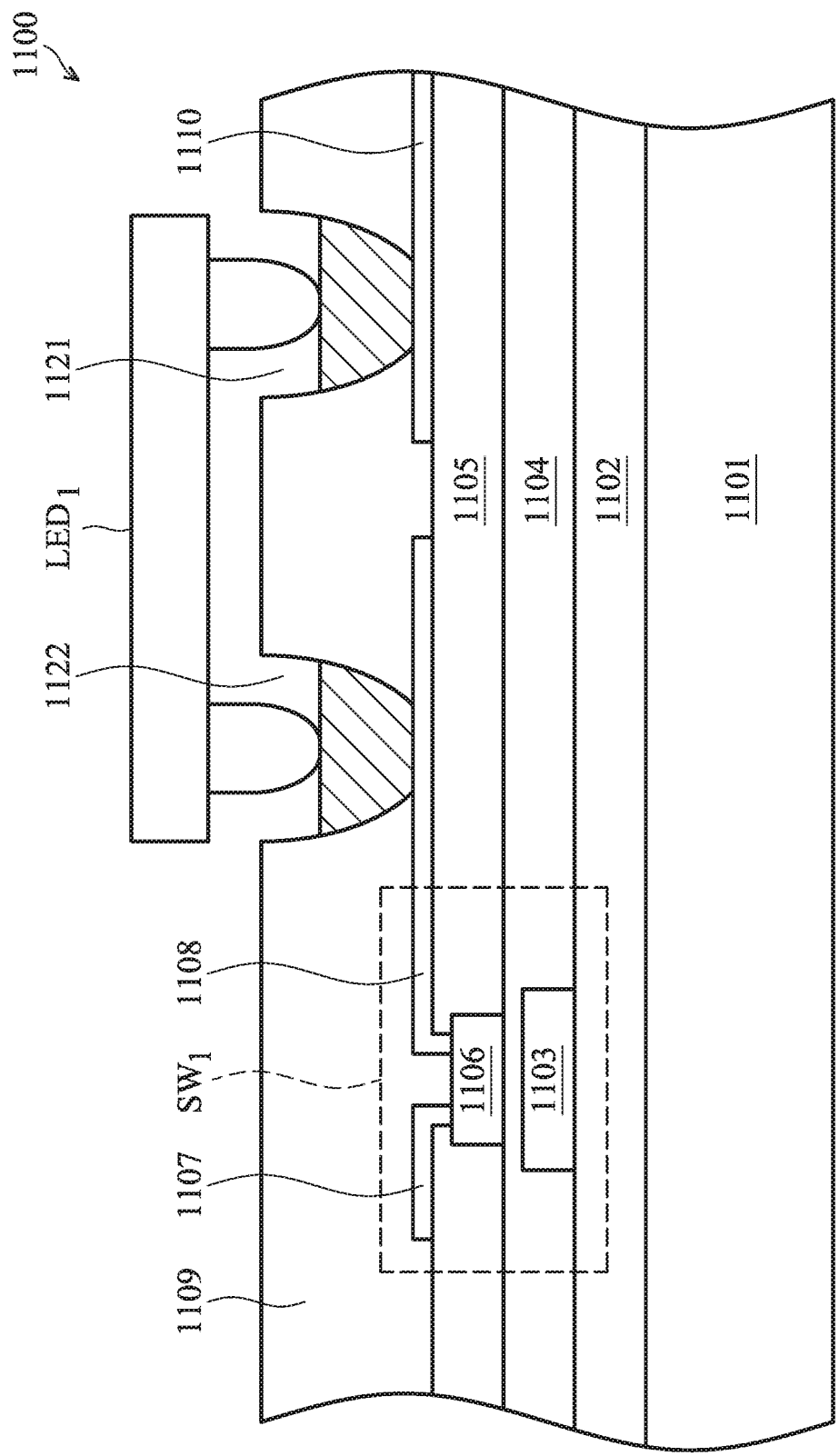
FIG. 11 is a schematic diagram of another exemplary embodiment of the display panel, according to various aspects of the present disclosure.

FIG. 11 is a schematic diagram of another exemplary embodiment of the display panel, according to various aspects of the present disclosure. The display panel 1100 comprises a substrate 1101, an insulating layer 1102, a gate electrode 1103, a gate dielectric 1104, an insulating layer 1105, a semiconductor layer 1106, a drain 1107, a source 1108, a metal block 1110, and an insulating layer 1109. In this embodiment, the gate electrode 1103, the drain 1107, and the source 1108 constitute a transistor. The transistor can serve as the first switch SW1 of the pixel unit 201 shown in FIG. 2A.

Additionally, in this embodiment, the insulating layer 1109 is formed on the substrate 1101 and comprises many indentations to hold the light-emitting diode. For brevity, only two indentations 1121 and 1122 are shown in FIG. 11. The indentations 1121 and 1122 are configured to hold two pins of the first light-emitting diode $LED_1$. In one embodiment, the indentation 1121 is configured to hold a first electrode (e.g. the anode of the cathode) of the first light-emitting diode $LED_1$. In such cases, the indentation 1122 is configured to hold the second electrode (e.g. the cathode or the anode) of the first light-emitting diode $LED_1$.

The disclosure is not limited by the method of forming the indentations 1121 and 1122. In one embodiment, the indentations 1121 and 1122 are formed by a Photo lithography technology. Then, lithography manufacturing processes and a metal film-formative technology are utilized to fill metal (e.g. copper, tin, or indium) in the indentations 1121 and 1122. Finally, the two pins of the first light-emitting diode $LED_1$ are bonded in the metal layer of the indentations 1121 and 1122. Since the indentations 1121 and 1122 are formed, alignment errors can be avoided or corrected to increase stability during the bonding process.

Figure 12:
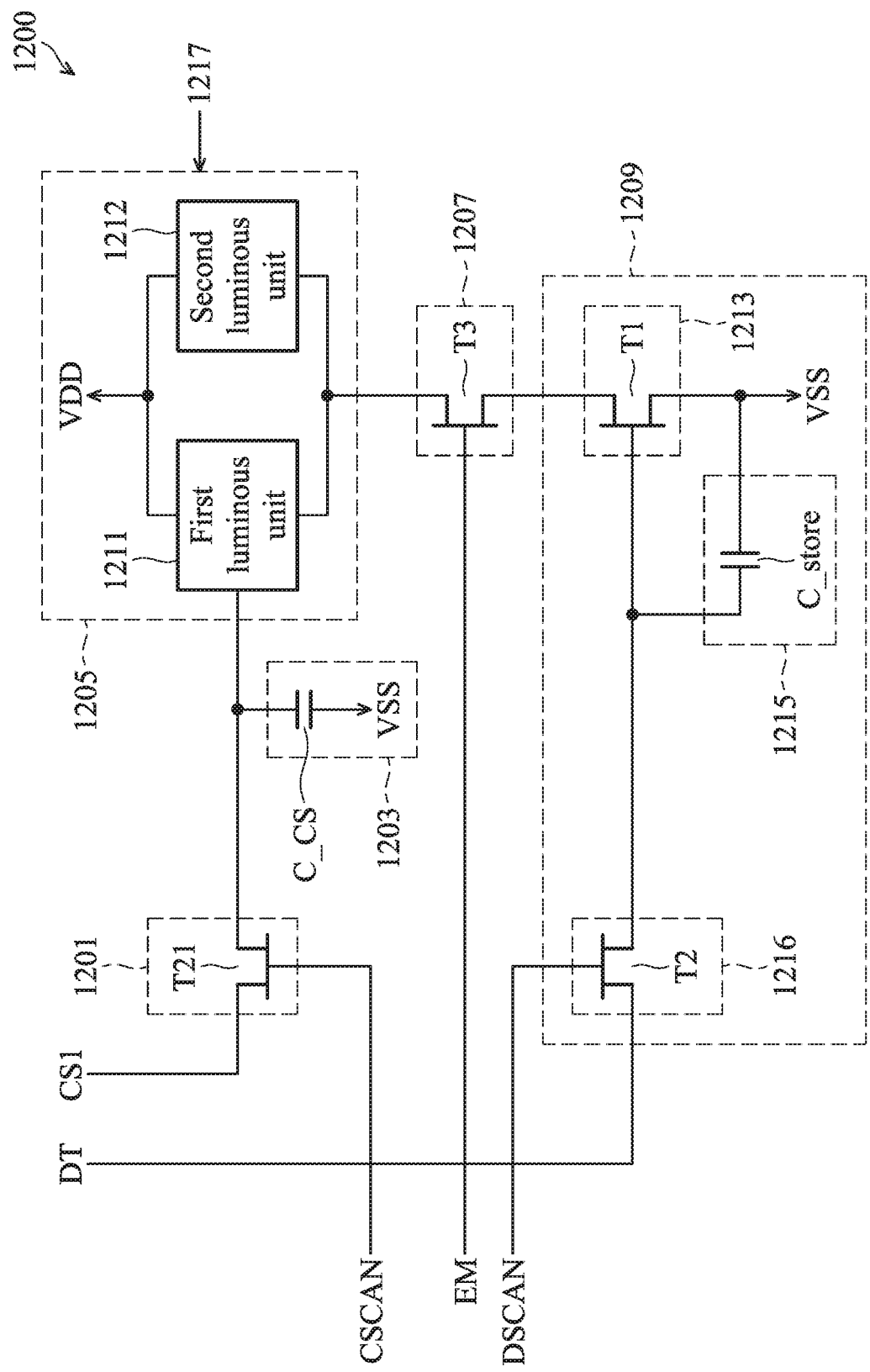
FIG. 12 is a schematic diagram of another exemplary embodiment of the pixel unit, according to various aspects of the present disclosure.

FIG. 12 is a schematic diagram of another exemplary embodiment of the pixel unit, according to various aspects of the present disclosure. The pixel unit 1200 comprises a first transmission switch 1201, a first storage element 1203, a luminous device 1205, an emitting switch 1207 and a level set unit 1209. The first transmission switch 1201 receives a first scan signal CSCAN and a first selection signal CS1. When the first scan signal CSCAN is enabled, the first transmission switch 1201 transmits the first selection signal CS1 to the first storage element 1203. In this embodiment, the first transmission switch 1201 is an N-type transistor T21. The gate of the N-type transistor 121 receives the first scan signal CSCAN. The drain of the N-type transistor T21 receives the first selection signal CS1. The source of the N-type transistor T21 is coupled to the first storage element 1203. In other embodiments, the first transmission switch 1201 is a P-type transistor.

The first storage element 1203 is coupled to the first transmission switch 1201. When the first transmission switch 1201 transmits the first selection signal CS1 to the first storage element 1203, the first storage element 1203 is charged according to the first selection signal CS1. The disclosure is not limited by the type of first storage element 1203. Any device can serve as the first storage element 1203, as long as the device is capable of storing voltage. In this embodiment, the first storage element 1203 is a capacitor C_CS. One terminal of the capacitor C_CS is coupled to the first transmission switch 1201. Another terminal of the capacitor C_CS receives the second operation voltage VSS.

The luminous device 1205 comprises many luminous units. A first luminous unit among the luminous units is designated as a predetermined luminous unit and the other luminous units are designated as backup luminous units. In an emitting period, the predetermined luminous unit is lit and the backup luminous units are not lit. When the first luminous unit fails, one of the backup luminous units is designated as a new predetermined luminous unit to maintain the operation of the pixel unit 1200. For brevity, only the first luminous unit 1211 and the second luminous unit 1212 are shown in FIG. 12. In some embodiments, the luminous device 1205 may comprise more luminous units.

As shown in FIG. 12, the first luminous unit 1211 is coupled to the second luminous unit in parallel. In one embodiment, a designation signal 1217 is utilized to designate the first luminous unit or the second luminous unit as a predetermined luminous unit and designate the other as a backup luminous unit. When the predetermined luminous unit is lit, the backup luminous unit may not be lit. When the predetermined luminous unit fails, the backup luminous unit is lit.

The emitting switch 1207 is coupled to the first luminous unit 1211 and the second luminous unit 1212 and receives an emitting signal EM. When the emitting signal EM is enabled, the emitting switch 1207 is turned on. At this time, a luminous unit of the luminous device 1205 is lit. In this embodiment, the emitting switch 1207 is an N-type transistor T3, but the disclosure is not limited. In other embodiments, the emitting switch 1207 is a P-type transistor. As shown in FIG. 12, the gate of the N-type transistor T3 receives the emitting signal EM. The drain of the N-type transistor T3 is coupled to the luminous device 1205. The source of the N-type transistor T3 is coupled to the level set unit 1209.

The level set unit 1209 is coupled to the emitting switch 1207 to provide a predetermined level to the emitting switch 1207. In this embodiment, the level set unit 1209 comprises a second transmission switch 1216, a third transmission switch 1213, and a second storage element 1215. The second transmission switch 1216 receives the data signal DT and a second scan signal DSCAN. In one embodiment, the second scan signal DSCAN is the same as the first scan signal CSCAN. In such cases, one scan signal is omitted, such as the second scan signal DSCAN.

In this embodiment, the second transmission switch 1216 is an N-type transistor T2. The gate of the N-type transistor T2 receives the second scan signal DSCAN. The drain of the N-type transistor T2 receives the data signal DT. The source of the N-type transistor T2 is coupled to the third transmission switch 1213 and the second storage element 1215. In other embodiments, the second transmission switch 1216 is a P-type transistor.

The third transmission switch 1213 is coupled to the second transmission switch 1216 and the emitting switch 1207. In this embodiment, the third transmission switch 1213 is an N-type transistor T1. The gate of the N-type transistor T1 is coupled to the source of the N-type transistor T2. The drain of the N-type transistor T1 is coupled to the source of the N-type transistor T3. The source of the N-type transistor T1 receives the second operation voltage VSS. In other embodiments, the third transmission switch 1213 is a P-type transistor.

The second storage element 1215 is coupled to the second transmission switch 126 and the third transmission switch 1213. In this embodiment, the second storage element 1215 is a capacitor C_store, but the disclosure is not limited thereto. In other embodiments, any device can serve as the second storage element, as long as the device is capable of storing voltage. As shown in FIG. 12, one terminal of the capacitor C_store is coupled to the gate of the N-type transistor T1 and the other terminal of the capacitor C_store is coupled to the source of the N-type transistor T1.

When the second scan signal DSCAN is enabled, the second transmission switch 1216 is turned on. Therefore, the second storage element 1215 charged according to the data signal DT, and the third transmission switch 1213 is turned on. At this time, the emitting switch 1207 receives the second operation voltage VSS (i.e. a predetermined level).

The disclosure is not limited by the type of data signal DT. In one embodiment, the data signal DT may be a current signal or a voltage signal.

When the emitting signal EM is enabled, the emitting switch 1207 is turned on. At this time, the third transmission switch 1213 is turned on according to the data signal DT stored in the second storage element 1215, and a predetermined luminous unit in the luminous device 1205 is turned on according to the voltage stored in the first storage element 1203. Therefore, the predetermined luminous unit provides the corresponding brightness.

Figure 13A:
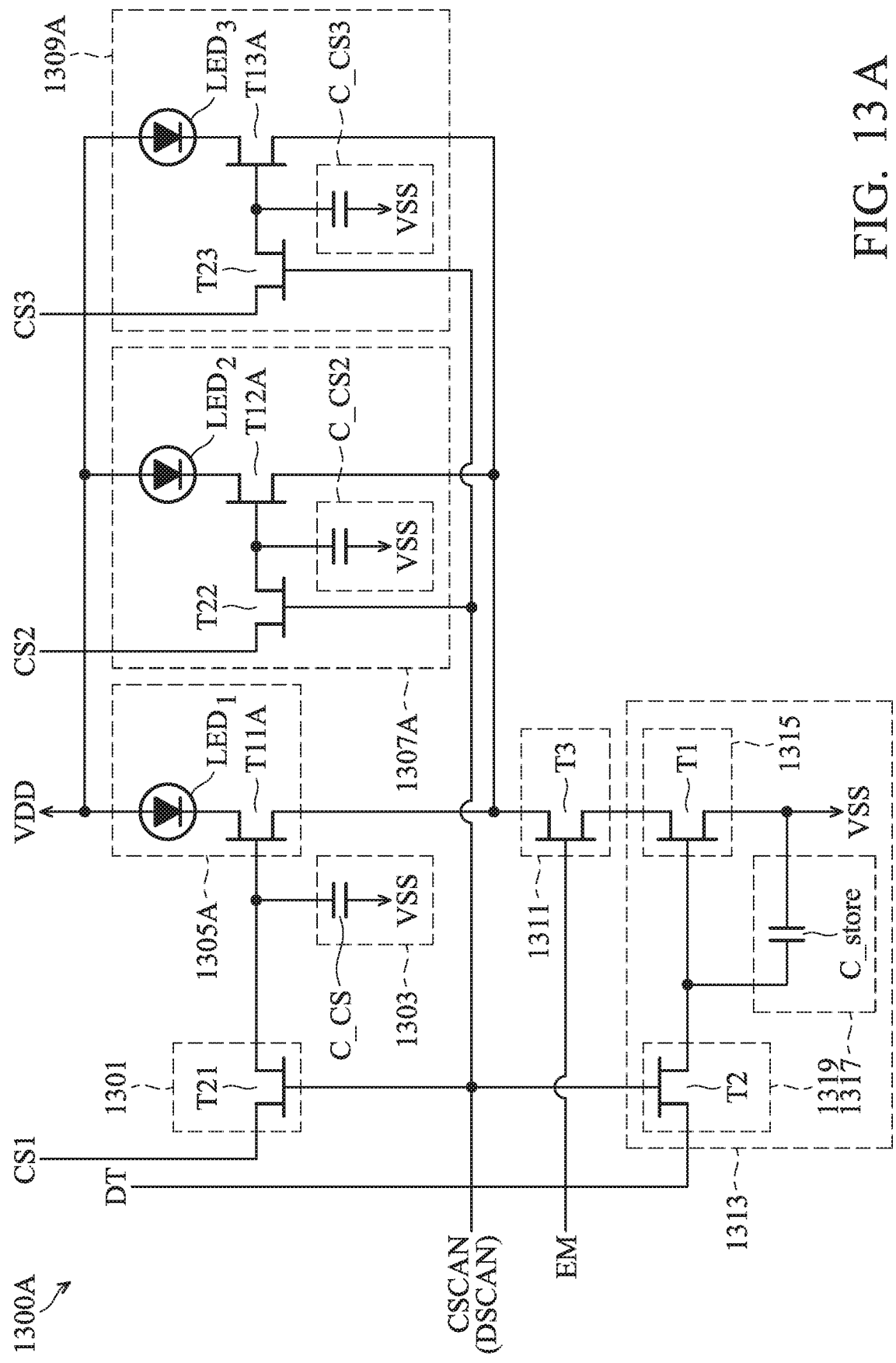
FIGS. 13A-13C are schematic diagrams of other exemplary embodiments of the pixel unit, according to various aspects of the present disclosure.
Figure 13:
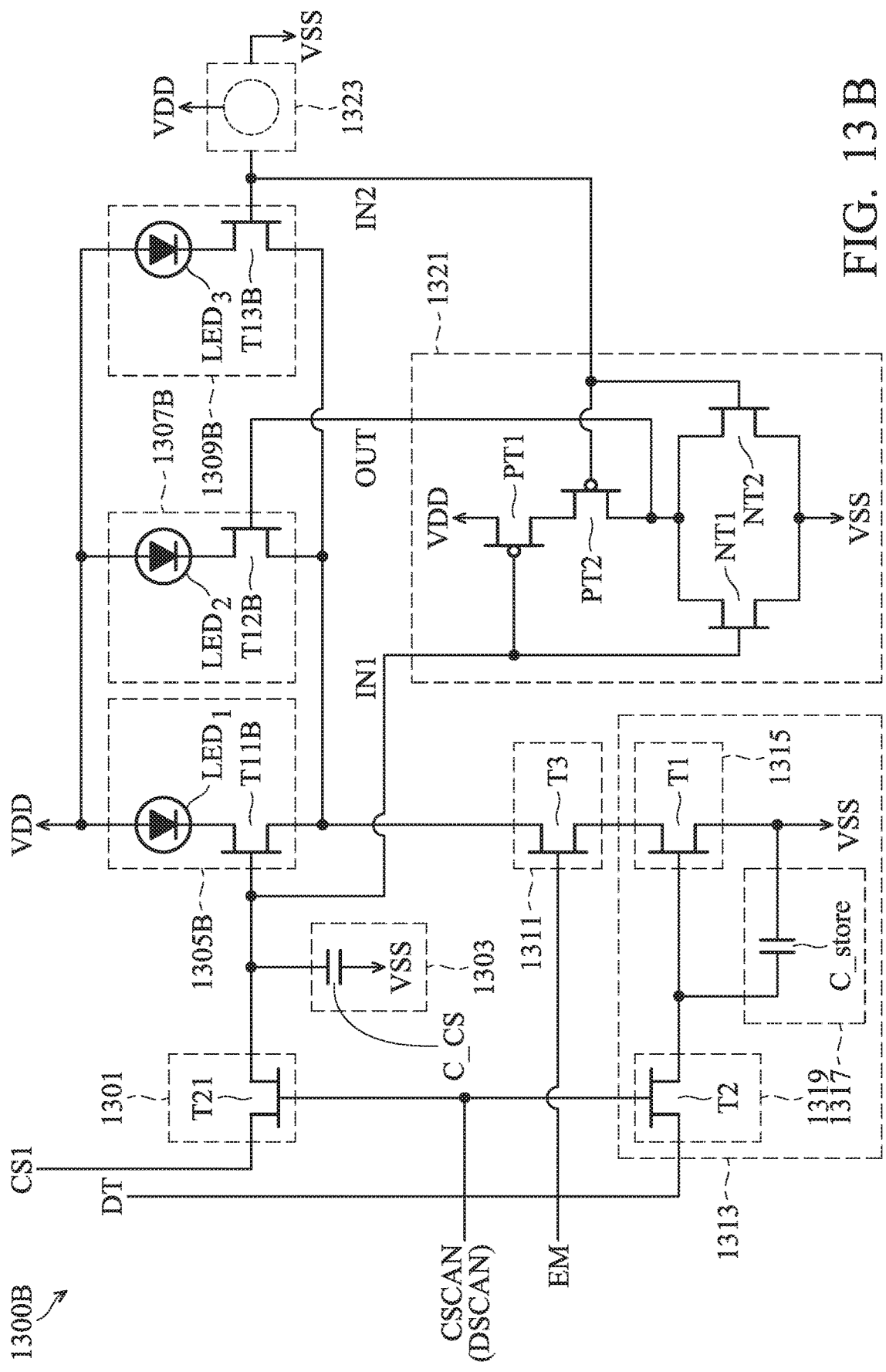

FIG. 13A is a schematic diagram of another exemplary embodiment of the pixel unit, according to various aspects of the present disclosure. The pixel unit 1300A comprises a first transmission switch 1301, a first storage element 1303, a first luminous unit 1305A, a second luminous unit 1307A, a third luminous unit 1309A, an emitting switch 1311, and a level set unit 1313. The operation of the first transmission switch 1301 shown in FIG. 13A is the same as the operation of the first transmission switch 1201 shown in FIG. 12. The operation of the first storage element 1303 shown in FIG. 13A is the same as the operation of the first storage element 1203 shown in FIG. 12. The operation of the emitting switch 1311 shown in FIG. 13A is the same as the operation of the emitting switch 1207 shown in FIG. 12. The operation of the level set unit 1313 shown in FIG. 13A is the same as the operation of the level set unit 1209 shown in FIG. 12. Therefore, descriptions of the first transmission switch 1301, the first storage element 1303, the emitting switch 1311, and the level set unit 1313 are omitted.

In this embodiment, the first luminous unit 1305A comprises a first switch T11A and a light-emitting diode LED$_1$. The first switch T11$a$ is an N-type transistor. The gate of the N-type transistor is coupled to the first transmission switch 1301. The drain of the N-type transistor is coupled to the cathode of the light-emitting diode LED$_1$. The source of the N-type transistor is coupled to the emitting switch 1311. The anode of the first light-emitting diode LED$_1$ receives the first operation voltage. In other embodiments, the first switch T11A is a P-type transistor.

The second luminous unit 1307A comprises a second storage element C_CS2, a second switch T12A, a third switch T22, and a second light-emitting diode LED$_2$. In one embodiment, the third switch 122 is an N-type transistor. The gate of the N-type transistor receives the first scan signal CSCAN. The drain of the N-type transistor receives a second selection signal CS2. The source of the N-type transistor is coupled to the second storage element C_CS2 and the second switch T12A. When the first scan signal CSCAN is enabled the third switch T22 transmits the second selection signal CS2. In other embodiments, the third switch T22 may be a P-type transistor.

One terminal of the second storage element C_CS2 is coupled to the second switch T12A. The other terminal of the second storage element C_CS2 receives the second operation voltage VSS. When the third switch T22 is turned on, the second storage element C_CS2 is charged according to the second selection signal CS2. In this embodiment, the second storage element C_CS2 is a capacitor, but the disclosure is not limited thereto. Any device can serve as the second storage element C_CS2, as long as the deice is capable of storing voltage.

The second switch T12A is coupled to the third switch 122, the second storage element C_CS2, and the second light-emitting diode LED$_2$. In one embodiment, the second switch T12A is an N-type transistor. The gate of the N-type transistor is coupled to the third switch T22 and the second storage element C_CS2. The drain of the N-type transistor is coupled to the cathode of the second light-emitting diode LED$_2$. The source of the N-type transistor is coupled to the emitting switch 1311. In other embodiments, the second switch T12A is a P-type transistor. The anode of the second light-emitting diode LED$_2$ receives the first operation voltage VDD. The cathode of the second light-emitting diode LED$_2$ is coupled to the second switch T12A.

The third luminous unit 1309A comprises a third storage element C_CS3, a fourth switch T13A, a fifth switch T23, and a third light-emitting diode LED$_3$. Since the circuit structure of the third luminous unit 1309A is the same as the circuit structure of the second luminous unit 1307A, a description of the circuit structure of the third luminous unit 1309A is omitted. Additionally, in this embodiment, the second scan signal DSCAN received by the level set unit 1313 is the same as the first scan signal CSCAN.

In one embodiment, when the first selection signal CS1 is at a first level (e.g. a high level) and the second selection signal CS2 and the third selection signal CS3 are at a second level (e.g. a low level), it means that the first luminous unit 1305 is designated as a predetermined luminous unit and the second luminous unit 1307A and the third luminous unit 1309A are designated as backup luminous units. At this time, when the first scan signal CSCAN is enabled, the first transmission switch 1301 transmits the first selection signal CS1 to the first storage element 1303 to charge the first storage element 1303, and the level set unit 1313 provides a predetermined level (e.g. the second operation voltage VSS) to the emitting switch 1311. At this time, the second storage element 1317 of the level set unit 1313 is charged according to the data signal DT. Since the second selection signal CS2 and the third selection signal CS3 are the second level, the second switch T12A and the fourth switch T13A are turned off.

When the emitting signal EM is enabled, the emitting switch 1311 is turned on. At this time, the third transmission switch 1315 of the level set unit 1313 is turned on according to the data signal DT stored in the second storage element 1317, and the first switch T11A is turned on according to the voltage stored in the first storage element 1303. Therefore, the first light-emitting diode LED$_1$ is turned on.

In some embodiments, when the second selection signal CS2 is at the first level (e.g. the high level) and the first selection signal CS1 and the third selection signal CS3 is at the second level (e.g. the low level), it means that the second luminous unit 1307A is designated as a predetermined luminous unit. Therefore, when the first scan signal CSCAN is enabled, the second storage element C_CS2 is charged according to the second selection signal CS2. When the emitting switch 1311 is turned on, the second switch T12A is turned on according to the voltage stored in the second storage element C_CS2 and the third transmission switch 1315 of the level set unit 1313 is turned on according to the voltage stored in the second storage element 1317. Therefore, the second light-emitting diode LED$_2$ is lit.

FIG. 13B is a schematic diagram of another exemplary embodiment of the pixel unit, according to various aspects of the present disclosure. The pixel unit 1300B comprises a first transmission switch 1301, a first storage element 1303, a first luminous unit 1305B, a second luminous unit 1307B, a third luminous unit 1309B, an emitting switch 1311, a level set unit 1313, and a NOR circuit 1321. The operation of the first transmission switch 1301 shown in FIG. 13B is the same as the operation of the first transmission switch 1301 shown in FIG. 13A. The operation of the first storage element 1303 shown in FIG. 13B is the same as the operation of the first storage element 1303 shown FIG. 13A. The operation of the emitting switch 1311 shown in FIG. 13B is the same as the operation of the emitting switch 1311 shown in FIG. 13A. The operation of the level set unit 1313 shown in FIG. 13B is the same as the operation of the level set unit 1313 shown in FIG. 13A. Therefore, descriptions of the first transmission switch 1301, the first storage element 1303, the emitting switch 1311, and the level set unit 1313 are omitted.

The first luminous unit 1305B comprises a first switch T119 and a first light-emitting diode $LED_1$. The first switch T11B is an N-type transistor. The gate of the N-type transistor is coupled to the first storage element 1303. The drain of the N-type transistor is coupled to the cathode of the first light-emitting diode $LED_1$. The source of the N-type transistor is coupled to the emitting switch 1311. The anode of the light-emitting diode $LED_1$ receives the first operation voltage VDD.

The second luminous unit 1307B comprises a second switch T12B and a second light-emitting diode $LED_2$. The second switch T12B is an N-type transistor. The gate of the N-type transistor is coupled to the output of the NOR circuit 1321. The drain of the N-type transistor is coupled to the cathode of the second light-emitting diode $LED_2$. The source of the N-type transistor is coupled to the emitting switch 1311. The anode of the second light-emitting diode $LED_2$ receives the first operation voltage VDD.

The third luminous unit 1309B comprises a third switch T13B and a third light-emitting diode $LED_3$. The third switch T13B is an N-type transistor. The gate of the N-type transistor is coupled to the second input of the NOR circuit 1321 and a switch 1323. The drain of the N-type transistor is coupled to the cathode of the third light-emitting diode $LED_3$. The source of the N-type transistor is coupled to the emitting switch 1311. The anode of the third light-emitting diode $LED_3$ receives the first operation voltage VDD.

The switch 1323 is configured to provide the first operation voltage VDD or the second operation voltage VSS to the third switch T13B. In one embodiment, the switch 1323 comprises a first path and a second path. The first path is configured to transmit the first operation voltage VDD to the third switch T13B. The second path is configured to transmit the second operation voltage VSS to the third switch T13B. In one embodiment, the first path or the second path is cut off by a laser to control the voltage of the gate of the third switch T13B. In another embodiment the switch 1323 transmits the first operation voltage VDD or the second operation voltage VSS to the third switch T13B according to a control signal (not shown).

The NOR circuit 1321 comprises a first input IN1, a second input IN2 and an output OUT. The first input IN1 is coupled to the first switch T11B and the first storage element 1303. The second input IN2 is coupled to the third switch T13B. The output OUT is coupled to the second switch T12B. In this embodiment, the NOR circuit 1321 comprises a P-type transistor PT1, a P-type transistor PT2, an N-type transistor NT1, and an N-type transistor NT2. The gate of the P-type transistor PT1 is coupled to the first input IN1. The source of the P-type transistor PT1 receives the first operation voltage VDD. The gate of the P-type transistor PT2 is coupled to the second input IN2. The source of the P-type transistor PT2 is coupled to the drain of the P-type transistor PT1. The gate of the N-type transistor NT1 is coupled to the first input IN1. The drain of the N-type transistor NT1 is coupled to the drain of the P-type transistor PT2. The source of the N-type transistor NT1 receives the second operation voltage VSS. The gate of the N-type transistor NT2 is coupled to the second input IN2. The drain of the N-type transistor NT2 is coupled to the drain of the P-type transistor PT2, The source of the N-type transistor NT2 receives the second operation voltage VSS.

In this embodiment, the voltage levels of the first input IN1 and the second input IN2 are controlled to designate the first luminous unit 1305B, the second luminous unit 1307B or the third luminous unit 1309B as a predetermined luminous unit. For example, when the voltage level of the first input IN1 is a first level (e.g. a high level) and the voltage level of the second input IN2 is a second level (e.g. a low level), the first luminous unit 1305B is designated as a predetermined luminous unit. At this time, the second luminous unit 1307B and the third luminous unit 1309B are backup luminous units. In such cases, when the first scan signal CSCAN is enabled, the first transmission switch 1301 transmits the first selection signal CS1 to the first storage element 1303 to charge the first storage element 1303, and the second transmission switch 1319 transmits the data signal DT to the second storage element 1317 to charge the second storage element 1317. When the emitting signal EM is enabled, the emitting switch 1311 is turned on. At this time, the first switch T11B is turned on according to the voltage stored in the first storage element 1303. Additionally, the third transmission switch 1315 of the level set unit 1313 is turned on according to the voltage stored in the second storage element 1317. Therefore, the first light-emitting diode $LED_1$ is lit.

In another embodiment, when the voltage levels of the first input IN and the second input IN2 are the second level (e.g. the low level), the P-type transistors PT1 and PT2 are turned on. Therefore, the second luminous unit 1307B is designated as a predetermined luminous unit. Since the voltage levels of the first input IN and the second IN2 are the second level, the first luminous unit 1305B and the third luminous unit 1309B serve as backup luminous units. In such cases, when the first scan signal CSCAN is enabled, the first transmission switch 1301 transmits the first selection signal CS1 to the first storage element 1303 to charge the first storage element 1303, and the second transmission switch 1319 transmits the data signal DT to the second storage element 1317 to charge the second storage element 1317. When the emitting signal EM is asserted, the emitting switch 1311 is turned on. At this time, the second switch T12B is turned on according to the voltage stored in the first storage element 1303. Furthermore, the third transmission switch 1315 of the level set unit 1313 is turned on according to the voltage stored in the second storage element 1317. Therefore, the second light-emitting diode $LED_2$ is turned on.

In other embodiments, when the voltage level of the first input IN1 is the second level (e.g. the low level) and the voltage level of the second input IN2 is the first level (e.g. the high level), since the third switch T13B is turned on, the third luminous unit 1309B is designated as a predetermined luminous unit. At this time, since the first switch T11B and the second switch T12B are turned off, the first luminous unit 1305B and the second luminous unit 1307B serve as backup luminous units. In such cases, when the first scan signal CSCAN is asserted, the first transmission switch 1301 transmits the first selection signal CS1 to the first storage element 1303 to charge the first storage element 1303, and the second transmission switch 1319 transmits the data signal DT to charge the second storage element 1317. When the emitting signal EM is enabled, the emitting switch 1311 is turned on. At this time, the third switch T13B is turned on according to the voltage stored in the first storage element 1303. Additionally, the third transmission switch 1315 of the level set unit 1313 is turned on according to the voltage stored in the second storage element 1317. Therefore, the third light-emitting diode LED$_3$ is lit.

Figure 13C:
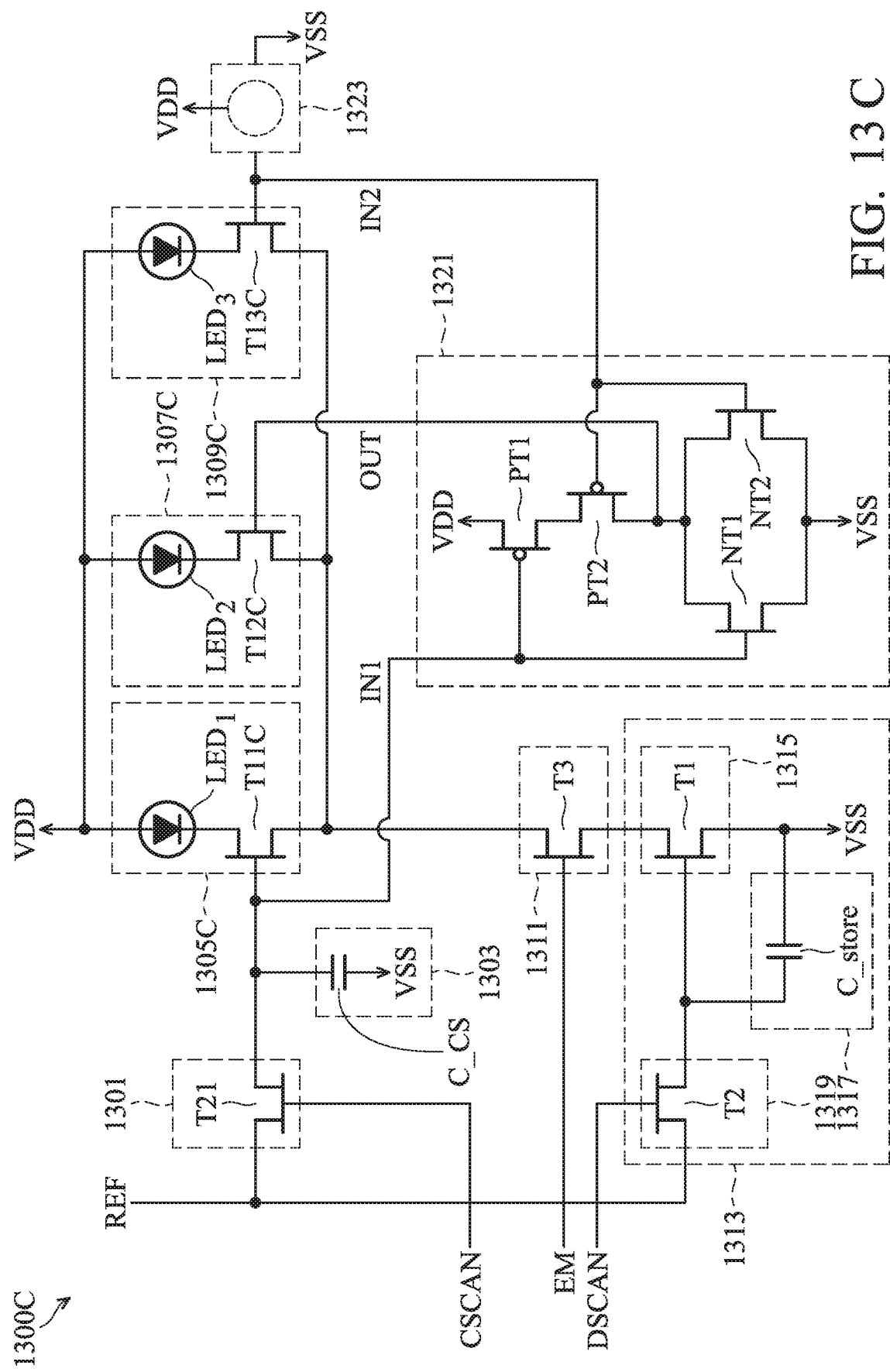

FIG. 13C is a schematic diagram of another exemplary embodiment of the pixel unit, according to various aspects of the present disclosure. The pixel unit 1300C comprises a first transmission switch 1301, a first storage element 1303, a first luminous unit 1305C, a second luminous unit 1307C, a third luminous unit 1309C, an emitting switch 1311, a level set unit 1313 and an NOR circuit 1321. The operation of the first transmission switch 1301 shown in FIG. 13C is the same as the operation of the first transmission switch 1301 shown in FIG. 13B. The operation of the first storage element 1303 shown in FIG. 13C is the same as the operation of the first storage element 1303 shown in FIG. 13B. The operation of the emitting switch 1311 shown in FIG. 13C is the same as the operation of the emitting switch 1311 shown in FIG. 13B. The operation of the first luminous unit 1305C shown in FIG. 13C is the same as the operation of the first luminous unit 1305B shown in FIG. 13B. The operation of the second luminous unit 1307C shown in FIG. 13C is the same as the operation of the second luminous unit 1307B shown in FIG. 13B. The operation of the third luminous unit 1309C shown in FIG. 13C is the same as the operation of the third luminous unit 1309E shown in FIG. 13B. A description of the operations of the first transmission switch 1301, the first storage element 1303, the emitting switch 1311, the first luminous unit 1305C, the second luminous unit 1307C, and the third luminous unit 1309C is omitted.

In this embodiment, the second scan signal DSCAN is different from the first scan signal CSCAN. In one embodiment, when the first scan signal CSCAN is enabled, the second scan signal DSCAN is disabled. When the scan signal DSCAN is enabled, the first scan signal CSCAN is disabled. Furthermore, the designation method to designate the first luminous unit 1305C, the second luminous unit 1307C, or the third luminous unit 1309C as a predetermined luminous unit is the same as the designation method described in FIG. 13B. Therefore, the designation method to designate the first luminous unit 1305C, the second luminous unit 1307C, or the third luminous unit 1309C as the predetermined luminous unit is omitted.

When the first scan signal CSCAN is enabled, the first transmission switch 1301 transmits the reference signal REF to the first storage element 1303. Therefore, the first storage element 1303 is charged according to the reference signal REF. When the second scan signal DSCAN is enabled, the second transmission switch 1319 transmits the reference signal REF to the second storage element 1317. Therefore, the second storage element 1317 is charged according to the reference signal REF. When the emitting signal EM is enabled, the emitting switch 1311 is turned on. At this time, the predetermined luminous unit is lit.

Figure 14:
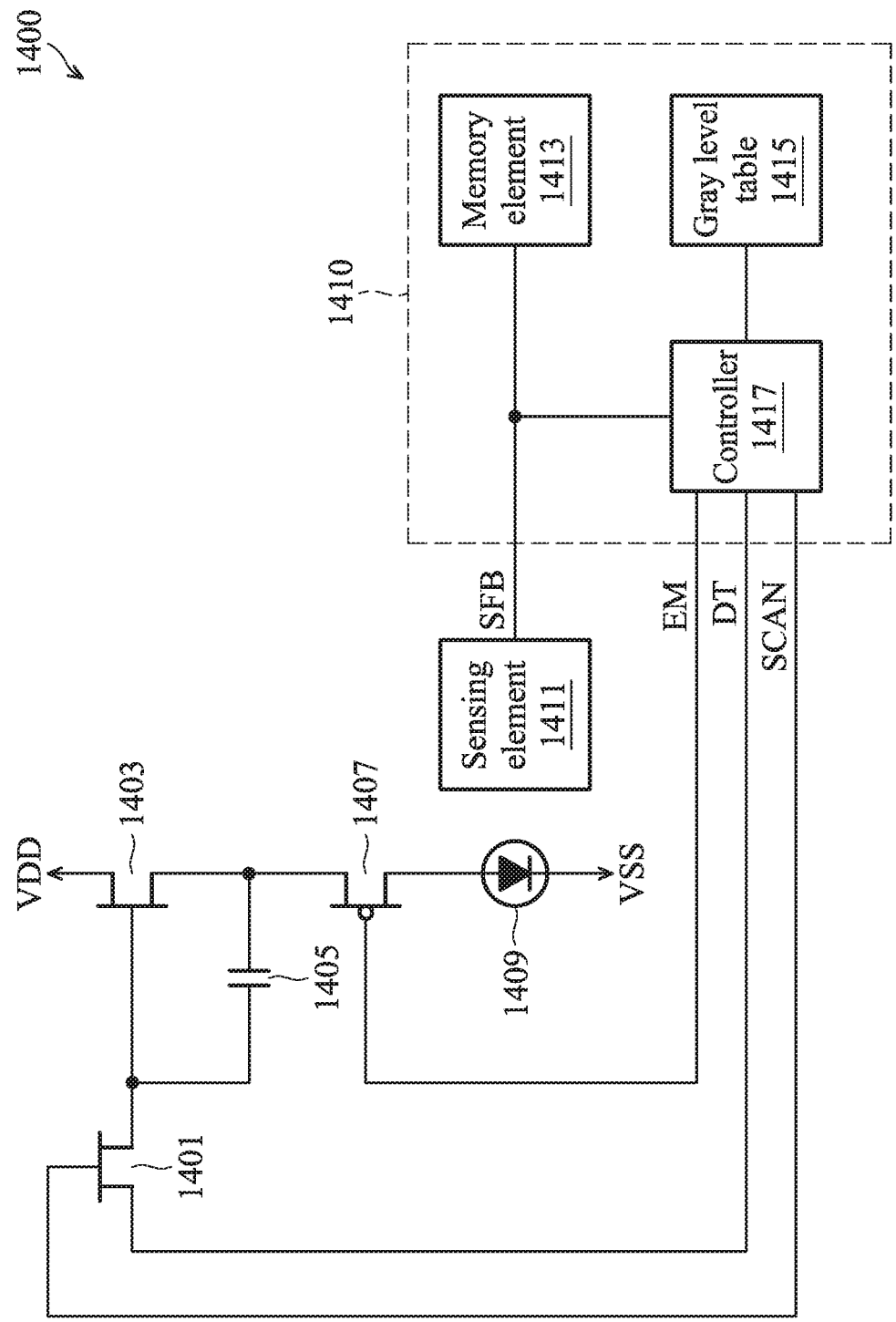
FIG. 14 is a schematic diagram of another exemplary embodiment of the pixel unit, according to various aspects of the present disclosure.

FIG. 14 is a schematic diagram of another exemplary embodiment of the pixel unit, according to various aspects of the present disclosure. The pixel unit 1400 comprises a first transistor 1401, a second transistor 1403, a storage element 1405, a third transistor 1407, a light-emitting diode 1409, and a sensing element 1411.

The gate of the first transistor 1401 receives a scan signal SCAN. The drain of the first transistor 1401 receives a data signal DT. In this embodiment, the first transistor 1401 is an N-type transistor, but the disclosure is not limited thereto. In other embodiments, the first transistor 1401 is a P-type transistor. The disclosure is not limited by the type of data signal DT. The data signal DT may be a voltage signal or a current signal.

The gate of the second transistor 1403 is coupled to the source of the first transistor 1401 and the storage element 1405. The drain of the second transistor 1403 receives the first operation voltage VDD. In one embodiment, the type of the second transistor 1403 is the same as that of the first transistor 1401. As shown in FIG. 14, the first transistor 1401 and the second transistor 1403 are N-type transistors, but the disclosure is not limited thereto. In some embodiments, the type of the second transistor 1403 is different from that of the first transistor 1401. For example, one of the first transistor 1401 and the second transistor 1403 is an N-type transistor, and another of the first transistor 1401 and the second transistor 1403 is a P-type transistor.

One terminal of the storage element 1405 is coupled to the source of the first transistor 1401. The other terminal of the storage element 1405 is coupled to the source of the second transistor 1403. In this embodiment, the storage element 1405 is a capacitor, but the disclosure is not limited thereto. Any element can serve as a storage element 1405, as long as the element is capable of storing voltage.

The gate of the third transistor 1407 receives an emitting signal EM. The source of the third transistor 1407 is coupled to the source of the second transistor 1403. In this embodiment, the type of the third transistor 1407 is different from the type of the first transistor 1401. As shown in FIG. 14, the first transistor 1401 is an N-type transistor, and the third transistor 1407 is a P-type transistor, but the disclosure is not limited thereto. In other embodiments, the type of the third transistor 1407 is the same as the type of the first transistor 1401 or the second transistor 1403.

The anode of the light-emitting diode 1409 is coupled to the drain of the third transistor 1407. The cathode of the light-emitting diode 1409 receives the second operation voltage VSS. The sensing element 1411 detects the brightness of the light-emitting diode 1409 to generate a feedback signal SFB. The disclosure is not limited by the kind of sensing element 1411. Any element can serve as a sensing element 1411, as long as the element is capable of detecting brightness. In one embodiment, the sensing element 1411 is a light-emitting diode.

In this embodiment, a source driver 1410 receives and records the feedback signal SFB. As shown in FIG. 14, the source driver 1410 comprises a memory element 1413 to record each sensing result generated by each sensing element. Furthermore, the source driver 1410 has a gray level table 1415. The gray level table 1415 records brightness corresponding to different data signals.

In one embodiment, the controller 1417 generates an appropriate data signal DT according to the recorded result in the gray level table 1415 so that the light-emitting diode 1419 emits light. The brightness of the light is a predetermined value. Then, the controller 1417 determines whether the brightness of the light-emitting diode 1409 is equal to the predetermined value according to the feedback signal SFB. When the brightness of the light-emitting diode 1409 is not equal to the predetermined value, the controller 1417 controls at least one of the scan signal SCAN, the data signal DT and the emitting signal EM to adjust the brightness of the light-emitting diode 1409. In another embodiment, the controller 1417 does not directly adjust the brightness of the light-emitting diode 1409. In such cases, the controller 1417 may adjust the brightness of the pixel unit (not shown) neighboring the pixel unit 1400 to compensate for the shift in brightness of the light-emitting diode 1409.

Figure 15:
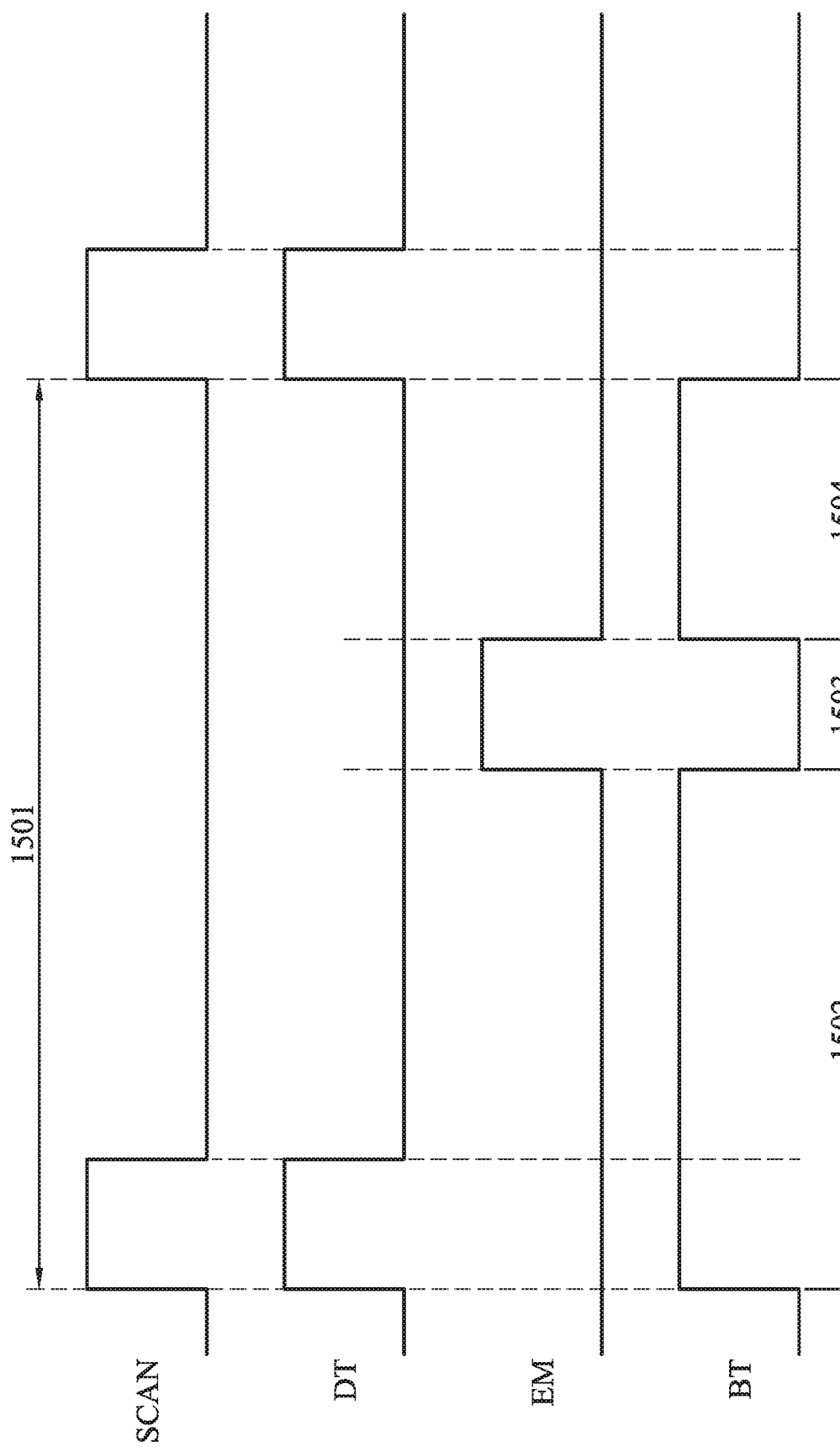
FIGS. 15A and 15B are timing schematic diagrams of other exemplary embodiments of the pixel unit, according to various aspects of the present disclosure.

FIG. 15A is a timing schematic diagram of an exemplary embodiment of the pixel unit, according to various aspects of the present disclosure. Referring to FIG. 14, the scan signal SCAN is enabled one time in a frame 1501. When the scan signal SCAN is enabled, the first transistor 1401 is turned on. The storage element 1405 is charged according to the data signal DT. Since the emitting signal EM is enabled, the third transistor 1407 is turned on so that the light-emitting diode 1409 is turned on. When the scan signal SCAN is disabled, the second transistor 1403 is turned on according to the voltage stored in the storage element 1405. Therefore, the light-emitting diode 1409 is turned on in period 1502. The symbol BT represents the brightness of the light-emitting diode 1409.

In period 1503, when the controller 1417 determines that the brightness of the light-emitting diode 1409 is not equal to a predetermined brightness, the controller 1417 disables the emitting signal EM. Therefore, the light-emitting diode 1409 is turned off. In period 1504, the controller 1417 enables the emitting signal EM again. Therefore, the light-emitting diode 1409 is turned on again. In this embodiment, the controller 1417 adjusts the duration of period 1503 according to the difference between the real brightness of the light-emitting diode 1409 and the predetermined brightness. The brightness of the light-emitting diode 1409 is increased as the duration when the light-emitting diode 1409 is turned on increases. In another embodiment, the controller 1417 adjusts the brightness of the light-emitting diode 1409. In such cases, the brightness of the light-emitting diode 1409 in period 1504 may be higher than or less than the brightness of the light-emitting diode 1409 in period 1502.

Figure 15B:
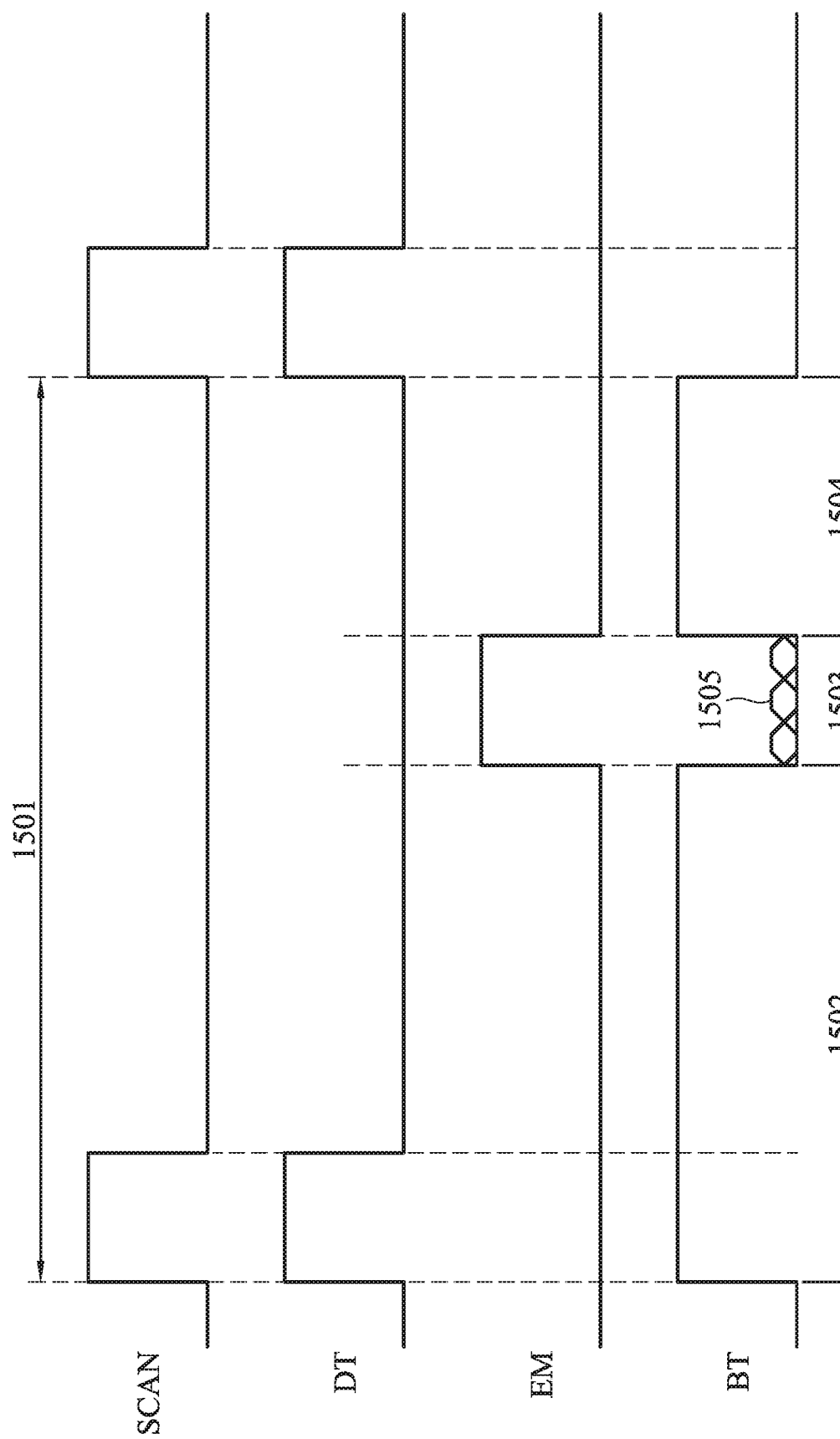

FIG. 15B is a timing schematic diagram of another exemplary embodiment of the pixel unit, according to various aspects of the present disclosure. FIG. 15B is similar to FIG. 15A except that when the light-emitting diode 1409 is turned off, the controller 1417 transmits an additional carrier wave 1505 via the pixel unit 1400 to control the peripheral device close the display panel.

For example, a user may utilize a remote control or a mobile phone to transmit control commands to a display panel. The controller 1417 generates the additional carrier wave 1505 according to the control commands. When an electronic device close to the display panel receives the additional carrier wave 1505, the electronic device performs a specific action. For example, when a desk lamp receives the additional carrier wave 1505, the desk lamp is lit. When an air conditioner receives the additional carrier wave 1505, the air conditioner is turned on. In another embodiment, the additional carrier wave 1505 generated by the controller 1417 is combined with the light provided by the light-emitting diode 1409. When the light-emitting diode 1409 provides the light, the light has a carrier wave to drive an external device. The external device is activated according to the light with the carrier wave to light a desk lamp or turn on an air conditioner.

Unless otherwise defined, all terms (including technical and scientific terms) used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and will not be interpreted in an idealized or overly formal sense unless expressly so defined herein. Also, the term "couple" is intended to mean either an indirect or direct electrical connection. Accordingly, if one device is coupled to another device, that connection may be through a direct electrical connection, or through an indirect electrical connection via other devices and connections.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A display panel, comprising:
a data line;
a first current source coupled to the data line and receiving a first operation voltage;
a first pixel unit comprising:
a first switch coupled to the first current source and receiving a first scan signal, wherein when the first scan signal is enabled, the first switch is turned on and receives a first current provided by the first current source; and
a first light-emitting diode coupled to the first switch, wherein when the first switch is turned on, the first current passes through the first light-emitting diode to turn on the first light-emitting diode;
a discharge circuit directly connected to the data line to discharge a voltage of the data line;
a capacitor coupled to the first switch;
a P-type transistor comprising a source directly connected to the capacitor and a drain directly connected to an anode of the first light-emitting diode;
an N-type transistor comprising a drain directly connected to the capacitor and a source directly connected to a cathode of the first light-emitting diode and the data line; and
a second pixel unit adjacent to the first pixel unit comprising:
a second switch receiving a second scan signal, wherein when the second scan signal is enabled, the second switch is turned on; and
a second light-emitting diode coupled to the second switch, wherein when the second switch is turned on, a second current passes through the second light-emitting diode to turn on the second light-emitting diode, and when the first switch and the second switch are not turned on, the discharge circuit discharges the voltage of the data line,
wherein:
the discharge circuit provides a second operation voltage to the data line, and the second operation voltage is less than the first operation voltage, and a gate of the P-type transistor is coupled to a gate of the N-type transistor.

2. The display panel as claimed in claim 1, further comprising:
a sensing element detecting brightness of the first light-emitting diode to generate a feedback signal.

3. The display panel as claimed in claim 2, wherein the first current source adjusts the first current according to the feedback signal.

4. The display panel as claimed in claim 1, further comprising:
a compensation circuit comprising a first terminal and a second terminal, wherein the first terminal is coupled to the first switch, the second terminal is coupled to the first light-emitting diode, and the compensation circuit is configured to compensate for a threshold voltage of the first switch.

5. The display panel as claimed in claim 1, further comprising:
an electrostatic discharge protection circuit coupled to the first switch.

6. The display panel as claimed in claim 1, further comprising:
a substrate; and
an insulating layer disposed on the substrate, wherein the insulating layer comprises a first indentation and a second indentation, the first light-emitting diode comprises a first electrode and a second electrode, the first indentation is configured to hold the first electrode, and the second indentation is configured to hold the second electrode.

7. The display panel as claimed in claim 1, wherein during a first period of a frame, the first switch is turned on and the first current passes through the first light-emitting diode, during a second period of the frame, the first switch is turned on and the second current passes through the first light-emitting diode, and the first current is the same as or different from the second current.

8. A display panel comprising:
a pixel unit comprising:
a first transmission switch receiving a first scan signal and a first selection signal;
a first storage element coupled to the first transmission switch;
a first luminous unit comprising:
a first switch coupled to the first storage element; and
a first light-emitting diode coupled to the first switch;
a second luminous unit coupled to the first light-emitting unit in parallel and comprising:
a second switch; and
a second light-emitting diode coupled to the second switch;
an emitting switch coupled to the first luminous unit and the second luminous unit and receiving an emitting signal to turn on one of the first light-emitting diode and the second light-emitting diode; and
a level set unit configured to provide a predetermined level to the emitting switch,
wherein:
the emitting switch is coupled between the level set unit and the first luminous unit, the first transmission switch is a first N-type transistor,
the level set unit comprises:
a second N-type transistor;
a third N-type transistor comprising a gate directly connected to a source of the second N-type transistor, a drain directly connected to the emitting switch; and
a second storage element directly connected between the gate of the third N-type transistor and a source of the third N-type transistor.

9. The display panel as claimed in claim 8, wherein the second luminous unit further comprises:
a third switch receiving the first scan signal and a second selection signal; and
a third storage element coupled to the third switch.

10. The display panel as claimed in claim 8, wherein the second N-type transistor comprises a gate directly connected to a gate of the first N-type transistor, and a drain receiving a data signal.

11. The display panel as claimed in claim 8, further comprising:
an NOR circuit comprising a first input, a second input and an output, wherein the first input is coupled to the first storage element, and the output is coupled to the second switch.

12. The display panel as claimed in claim 8, wherein the second N-type transistor comprises a gate receiving a second scan signal and a drain receiving the first selection signal.

13. A display panel comprising:
at least one pixel unit comprising:
a first transistor comprising a first gate, a first drain and a first source, wherein the first gate receives a scan signal, and the first drain receives a data signal;
a second transistor comprising a second gate, a second drain and a second source, wherein the second gate is coupled to the first source, and the second drain receives a first operation voltage;
a storage element comprising two terminals, wherein one of the two terminals is coupled to the first source and another one of the two terminals is coupled to the second source;
a third transistor comprising a third gate, a third drain and a third source, wherein the first transistor and the second transistor are N-type transistors, and the third transistor is a P-type transistor, the third gate receives an emitting signal, and the third source is coupled to the second source;
a light-emitting diode comprising an anode and a cathode, wherein the anode is coupled to the third drain, and the cathode receives a second operation voltage;
a sensing element detecting brightness of the light-emitting diode to generate a feedback signal; and
a controller electrically connected to the sensing element and configured to determine whether the brightness of the light-emitting diode is equal to a predetermined value according to the feedback signal, and to adjust the emitting signal in response to the brightness of the light-emitting diode not being equal to the predetermined value.

14. The display panel as claimed in claim 13, further comprising:
a controller comparing the feedback signal and a predetermined signal to generate a compared result and adjusting the data signal according to the compared result.

15. The display panel as claimed in claim 13, wherein the light-emitting diode emits light with a carrier wave to drive an external device.

16. The display panel as claimed in claim 13, wherein during a first period, the scan signal is enabled, the first transistor is turned on to charge the storage element, and the emitting signal is enabled to turn on the light-emitting diode,
during a second period, the emitting signal is enabled to turn on the light-emitting diode,
during a third period, the emitting signal is disabled to turn off the light-emitting diode, and
during a fourth period, the emitting signal is enabled to turn on the light-emitting diode.

* * * * *